(12) United States Patent
Kim et al.

(10) Patent No.: US 8,329,537 B2
(45) Date of Patent: Dec. 11, 2012

(54) METHOD FOR FABRICATING REWRITABLE THREE-DIMENSIONAL MEMORY DEVICE

(75) Inventors: JinGyun Kim, Yongin-si (KR); Myoungbum Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 59 days.

(21) Appl. No.: 12/816,155

(22) Filed: Jun. 15, 2010

(65) Prior Publication Data
US 2011/0045657 A1   Feb. 24, 2011

(30) Foreign Application Priority Data
Aug. 24, 2009 (KR) ................ 10-2009-0078196

(51) Int. Cl.
*H01L 21/336* (2006.01)
(52) U.S. Cl. ............. 438/268; 438/212; 257/E21.212
(58) Field of Classification Search ........... 438/206, 438/209, 269, 532; 257/E21.532, E21.533, 257/E21.613
See application file for complete search history.

(56) References Cited

U.S. PATENT DOCUMENTS

| 6,274,439 B1 * | 8/2001 | Ito ........................... 438/278 |
| 2006/0199317 A1 * | 9/2006 | Kunii ........................ 438/151 |
| 2008/0029825 A1 * | 2/2008 | Saito et al. ................... 257/371 |

FOREIGN PATENT DOCUMENTS

| JP | 6-338602 | 12/1994 |
| JP | 10-93083 | 4/1998 |
| JP | 2007-317874 | 12/2007 |

OTHER PUBLICATIONS

Honda, S, Microscopic Study of the H20 Vapor Treatment of the Silicon Grain Boundaries, Journal of Non-Crystalline Solids, vol. 354, Feb. 20, 2008, pp. 2310-2313, Elsevier.

* cited by examiner

*Primary Examiner* — Cheung Lee
(74) *Attorney, Agent, or Firm* — Onello & Mello, LLP

(57) ABSTRACT

A method for fabricating a three-dimensional semiconductor memory device including three-dimensionally arranged transistors includes forming a thin film structure comprising a plurality of thin films on a semiconductor substrate, patterning the thin film structure such that a penetration region is formed to expose the semiconductor substrate, forming a polycrystalline semiconductor layer to cover the resultant structure where the penetration region is formed, patterning the semiconductor layer to locally form a semiconductor pattern within the penetration region, and performing a post-treatment process to treat the semiconductor layer or the semiconductor pattern with a post-treatment material containing hydrogen or deuterium.

20 Claims, 31 Drawing Sheets

METHOD FOR FABRICATING REWRITABLE THREE-DIMENSIONAL MEMORY DEVICE

CROSS-REFERENCE TO RELATED APPLICATIONS

This U.S. non-provisional patent application claims priority under 35 U.S.C. §119 to Korean Patent Application No. 10-2009-0078196, filed in the Korean Intellectual Property Office on Aug. 24, 2009, the entirety of which is hereby incorporated by reference.

BACKGROUND

1. Technical Field

The present inventive concept described herein relates to methods for fabricating semiconductor devices and, more particularly, to a method for fabricating a rewritable three-dimensional semiconductor memory device.

2. Description of Related Art

In order to meet ever-increasing needs of users for superior performance and low costs, there is a requirement for high integration density of semiconductor memory devices. In the case of conventional two-dimensional or planar semiconductor memory devices, their integration density is mainly determined by area occupied by a unit memory cell. Therefore, the conventional two-dimensional semiconductor memory devices are greatly affected by fine-pattern forming technologies. However, because extremely expensive equipment is needed to achieve fine patterns, the integration density of two-dimensional semiconductor memory devices is still limited while demand is continuing to increase.

Various technologies for three-dimensionally forming memory cells have been suggested to overcome the foregoing limitation. According to the technologies, three-dimensionally arranged memory cells allow area of a semiconductor substrate to be used effectively. For this reason, integration density of the three-dimensional memory device becomes higher than that of a two-dimensional semiconductor device.

SUMMARY

According to one aspect, the present inventive concept provides a method for fabricating a three-dimensional semiconductor memory device with three-dimensionally arranged memory transistors. The method includes forming a thin film structure comprising a plurality of thin films on a semiconductor substrate, patterning the thin film structure such that a penetration region is formed to expose the semiconductor substrate, forming a polycrystalline semiconductor layer to cover the resultant structure where the penetration region is formed, and patterning the semiconductor layer to locally form a semiconductor pattern within the penetration region. The method may further include performing a post-treatment process to treat the semiconductor layer or the semiconductor pattern with a post-treatment material containing hydrogen or deuterium.

In one embodiment, the semiconductor layer is formed of polysilicon including crystalline defects; and post-treating the semiconductor layer or the semiconductor pattern comprises bonding hydrogen ions or deuterium ions generated from the post-treatment material to atoms of the polysilicon to remove at least a portion of the crystalline defects.

In one embodiment, post-treating the semiconductor layer or the semiconductor pattern comprises supplying at least one of hydrogen gas, deuterium gas, vapor, deuterium vapor and ammonia to the semiconductor pattern.

In one embodiment, post-treating the semiconductor layer or the semiconductor pattern comprises generating hydrogen ions or deuterium ions from the post-treatment material through an annealing or plasma treatment.

In one embodiment, the method further includes forming a data storage film to cover an inner sidewall of the penetration region, wherein forming the semiconductor layer comprises filling the penetration region, where the data storage film is formed, with the semiconductor layer.

In one embodiment, the method further includes forming a data storage film to cover an inner sidewall of the penetration region, wherein forming the semiconductor layer comprises forming the semiconductor to define a gap region within the penetration region and cover an inner sidewall of the penetration region where the data storage film is formed, and a thickness of the semiconductor layer is smaller than a half width of the penetration region.

In one embodiment, the method further includes, before or after patterning the semiconductor layer, forming a filling layer to fill the gap region.

In one embodiment, post-treating the semiconductor layer or the semiconductor pattern is performed before or after forming the filling layer.

In one embodiment, post-treating the semiconductor layer or the semiconductor pattern comprises forming a filling layer to fill the gap region; forming the filling layer is performed before or after patterning the semiconductor layer, and the filling layer comprises the post-treatment material containing hydrogen or deuterium.

In one embodiment, the filling layer comprises at least one of SOG materials, hydrogen-rich oxide, hydrogen-rich nitride, and hydrogen-rich oxynitride.

In one embodiment, the thin film structure includes a first material layer and a second material layer stacked sequentially and repeatedly; and the first material layer is formed of an insulating material and the second material layer is formed of a conductive material.

In one embodiment, the thin film structure includes a first material layer and a second material layer stacked sequentially and repeatedly; and the first material layer and the second material layer are insulating layers formed of different materials.

In one embodiment, the method further includes forming a trench to penetrate the second material layer constituting the thin film structure between the semiconductor patterns; selectively removing the second material layers to form an undercut region exposing a sidewall of the semiconductor pattern between the first material layers; and forming conductive patterns to fill the undercut region.

In one embodiment, post-treating the semiconductor layer or the semiconductor pattern is performed at one or more points between forming the trench and forming the undercut region, between forming the undercut region and forming the conductive patterns, and after forming the conductive patterns.

In one embodiment, post-treating the semiconductor layer or the semiconductor pattern is performed at one or more points between forming the semiconductor layer and forming the semiconductor pattern or after forming the semiconductor pattern.

According to another aspect, the inventive concept is directed to a method for fabricating a three-dimensional semiconductor device including three-dimensionally arranged memory transistors and a plurality of semiconductor patterns used as channel regions of the memory transistors and disposed perpendicular to a semiconductor substrate. The method includes forming the semiconductor pattern of a polycrystalline semiconductor material; and post-treating polycrystalline semiconductor material with a post-treatment material containing hydrogen or deuterium.

In one embodiment, post-treating the polycrystalline semiconductor materials comprises supplying at least one of hydrogen gas, deuterium gas, vapor, deuterium vapor and ammonia to the semiconductor pattern.

In one embodiment, the method further includes, before forming the semiconductor pattern, forming a conductive layer used as a gate electrode of the memory transistor.

In one embodiment, the method further includes, after forming the semiconductor pattern, forming a conductive layer used as a gate electrode of the memory transistor.

In one embodiment, the semiconductor pattern is a hollow pattern having a gap region formed therein; and post-treating the polycrystalline semiconductor material comprises filling the gap region of the semiconductor pattern with the post-treatment material.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1A:
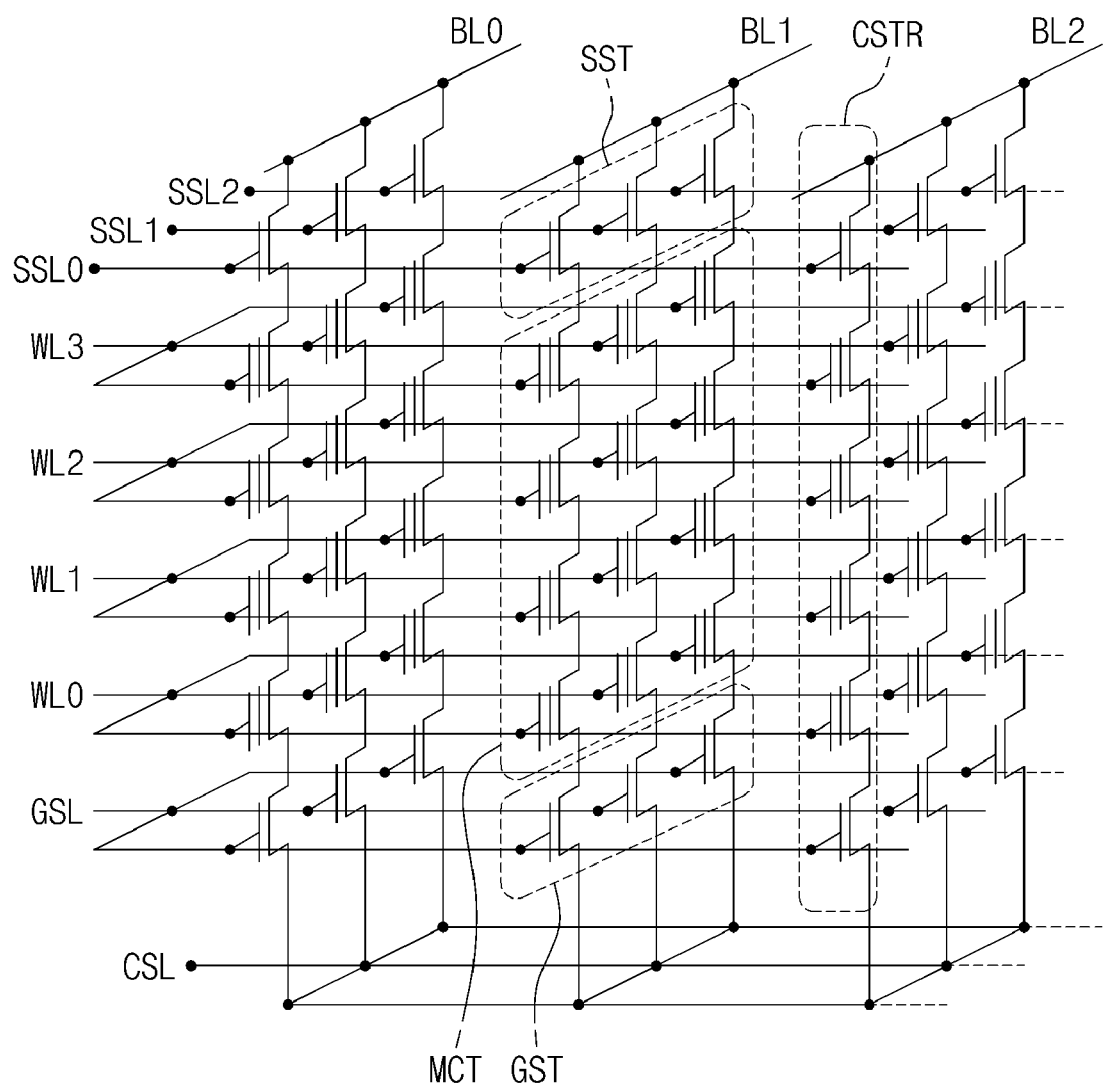
FIG. 1A is a circuit diagram of a three-dimensional semiconductor memory device according to embodiments of the inventive concept.

Advantages and features of the inventive concept and methods of accomplishing the same will be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this description will be thorough and complete and will fully convey the inventive concept to those skilled in the art, and the present invention will only be defined by the appended claims. Like reference numerals refer to like elements throughout the specification.

The terminology used herein is for the purpose of describing particular embodiments only and is not intended to limit the inventive concept. As used herein, the singular forms "a", "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when a layer is referred to as being "on" another layer or substrate, it can be directly on the other layer or substrate, or intervening layers may also be present.

Exemplary embodiments of the inventive concept will be described below with reference to cross-sectional views and/or plan views, which are exemplary drawings of the inventive concept. The exemplary drawings may be modified by manufacturing techniques and/or tolerances. Accordingly, the exemplary embodiments of the inventive concept are not limited to specific configurations shown in the drawings, and include modifications based on the fabricating method. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the inventive concept.

Embodiments of the inventive concept will now be described below in detail with reference to accompanying drawings. A semiconductor memory device according to the embodiments of the inventive concept has a three-dimensional structure.

Figure 1B:
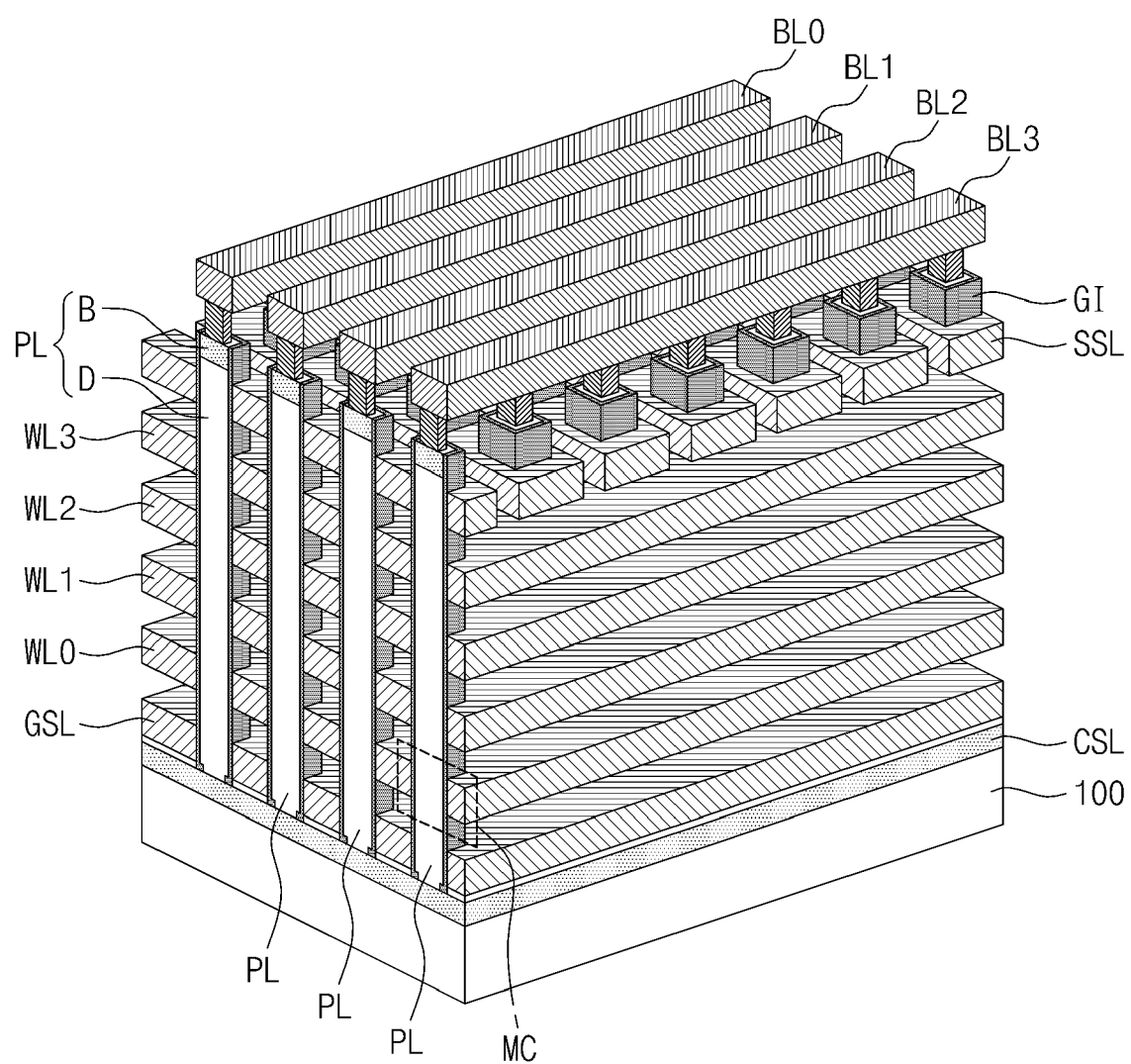
FIG. 1B is a perspective view of a three-dimensional semiconductor memory device according to an exemplary embodiment of the inventive concept.

FIG. 1A is a circuit diagram of a three-dimensional semiconductor memory device according to embodiments of the inventive concept, and FIG. 1B is a perspective view of a three-dimensional semiconductor memory device according to an exemplary embodiment of the inventive concept.

Referring to FIGS. 1A and 1B, the three-dimensional semiconductor memory device may include a common source line CSL, a plurality of bitlines BL0, BL1, BL2, and BL3, and a plurality of cell strings CSTR disposed between the common source line CSL and the bitlines BL0-BL3.

The common source line CSL may be a conductive thin film disposed on a semiconductor substrate 100 or an impurity region formed in a semiconductor substrate 100. The bitlines BL0-BL3 may be conductive patterns (e.g., metal lines) disposed on the semiconductor substrate 100 to be spaced apart therefrom. The bitlines BL0-BL3 are two-dimensionally arranged, and a plurality of cell strings CSTR are connected in parallel to the respective bitlines BL0-BL3. Thus, the cell string CSTR is two-dimensionally arranged on the common source line CSL or the substrate 100.

Each of the cell strings CSTR may include a ground select transistor GST connected to the common source line CSL, a string select transistor SST connected to the bitlines BL0-BL3, and a plurality of memory cell transistors MCT arranged between the ground and string select transistors GST and SST. The ground select transistor GST, the string select transistor SST, and the memory cell transistors MCT may be connected in series. Furthermore, the ground select line GSL, a ground select line GSL, a plurality of wordlines WL0-WL3, and a plurality of string select lines SSL arranged between the common source line CSL and the bitlines BL0-BL3 may be used as gate electrodes of a ground select transistor GST, memory cell transistors MCT, and string select transistors SST, respectively.

All the ground select transistors GST may be arranged at a substantially equivalent distance from the substrate 100. Gate electrodes of all the ground select transistors GST may be commonly connected to the ground select line GSL to remain in an equipotential state. For this purpose, the ground select line GSL may be a plate or comb-shaped conductive pattern disposed between the common source line CSL and a memory cell transistor MCT closest to the common source line CSL. Similarly, gate electrodes of the cell transistors MCT disposed at a substantially equivalent distance from the common source line CSL may also be commonly connected to one of the wordlines WL0-WL3 to remain in an equipotential state. For this purpose, each of the wordlines WL0-WL3 may be a plate or comb-shaped conductive pattern disposed in parallel to a top surface of the substrate 100. Since one cell string CSTR includes a plurality of memory cell transistors MCT disposed at different distances from the common source line CSL, multi-layer wordlines WL0-WL3 are formed between the common source line CSL and bitlines BL0-BL3.

Each of the cell strings CSTR may include a semiconductor pillar PL which perpendicularly extends from the common source line CSL to be connected to the bitlines BL0-BL3. The semiconductor pillars PL may be formed through the ground select line GSL and the wordlines WL0-WL3. The semiconductor pillar PL may include a body B and impurity regions formed one end or both ends of the body B. For instance, a drain region D may be formed at an upper end of the semiconductor pillar PL (i.e., between the body B and the bitlines BL0-BL3), as shown in FIG. 1B.

A data storage film may be disposed between he wordlines WL0-WL3 and the semiconductor pillar PL. According to an embodiment, the data storage film may be a charge storage film. The data storage film may be one of, for instance, a trap insulting layer, a floating gate electrode, and an insulating layer containing conductive nano dots.

A dielectric layer may be disposed between the ground select line GSL and the semiconductor pillar PL or between the string select line SSL and the semiconductor pillar PL to be used as a gate insulator of the ground select transistor GST or the string select transistor SST. Although at least one gate insulating layer of the ground and string select transistors GST and SST may be made of the same material as the data storage film of the memory cell transistor MCT, it may be a gate insulating layer (e.g., silicon oxide layer) for a conventional MOSFET.

Each of the ground and string select transistors GST and SST and the memory cell transistors MCT may be a MOS field effect transistor (MOSFET) using a semiconductor pillar PL as a channel region. According to another embodiment, with the ground select line GSL, the wordlines WL0-WL3, and the string select lines SSL, the semiconductor pillar PL may constitute a MOS capacitor. In this case, the ground select transistor GST, the memory cell transistors MCT, and the string select transistors SST may share an inversion layer formed by a fringe field from the ground select line GSL, the wordlines WL0-WL3, and the string select line SSL to be electrically connected to one another.

Figure 9:
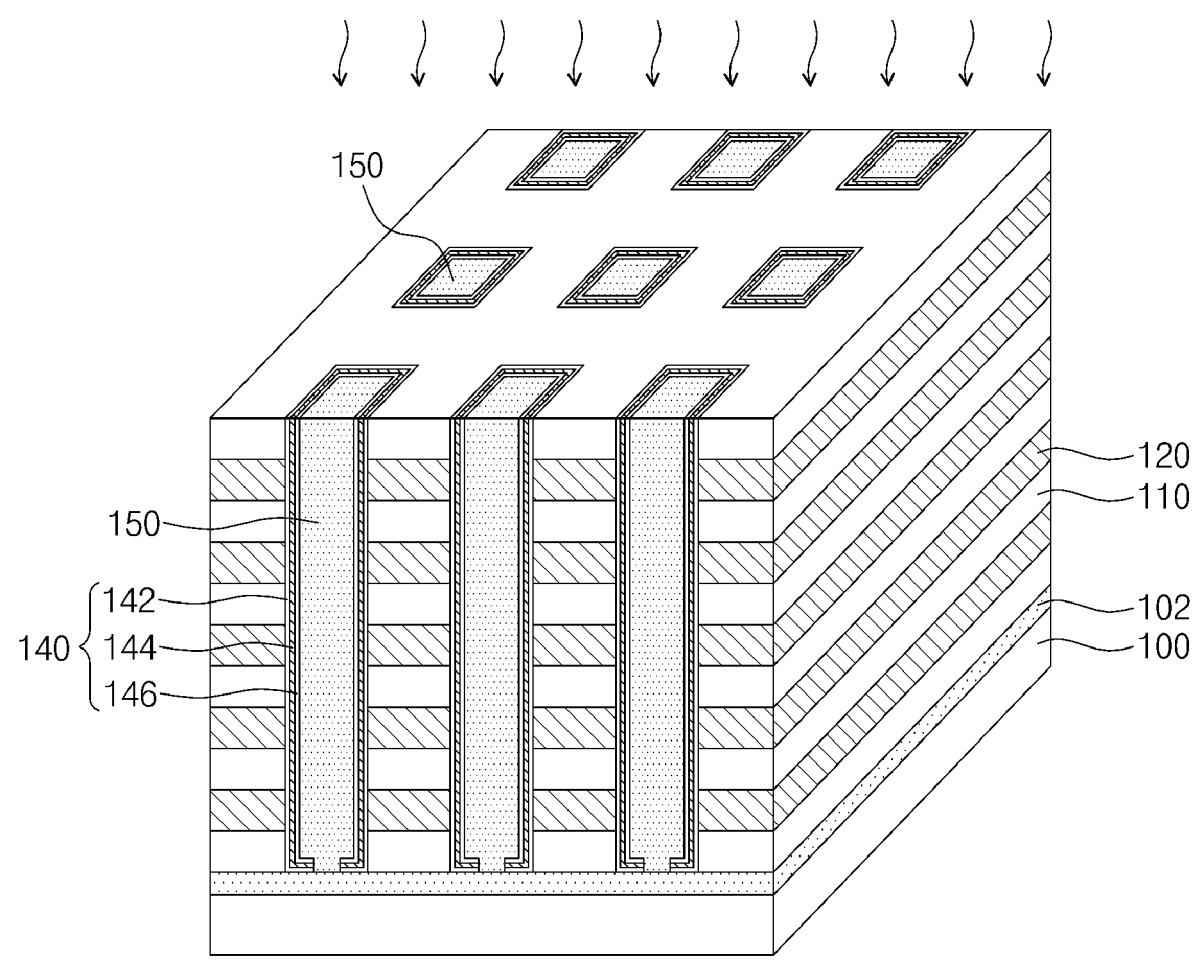
Figure 10A:
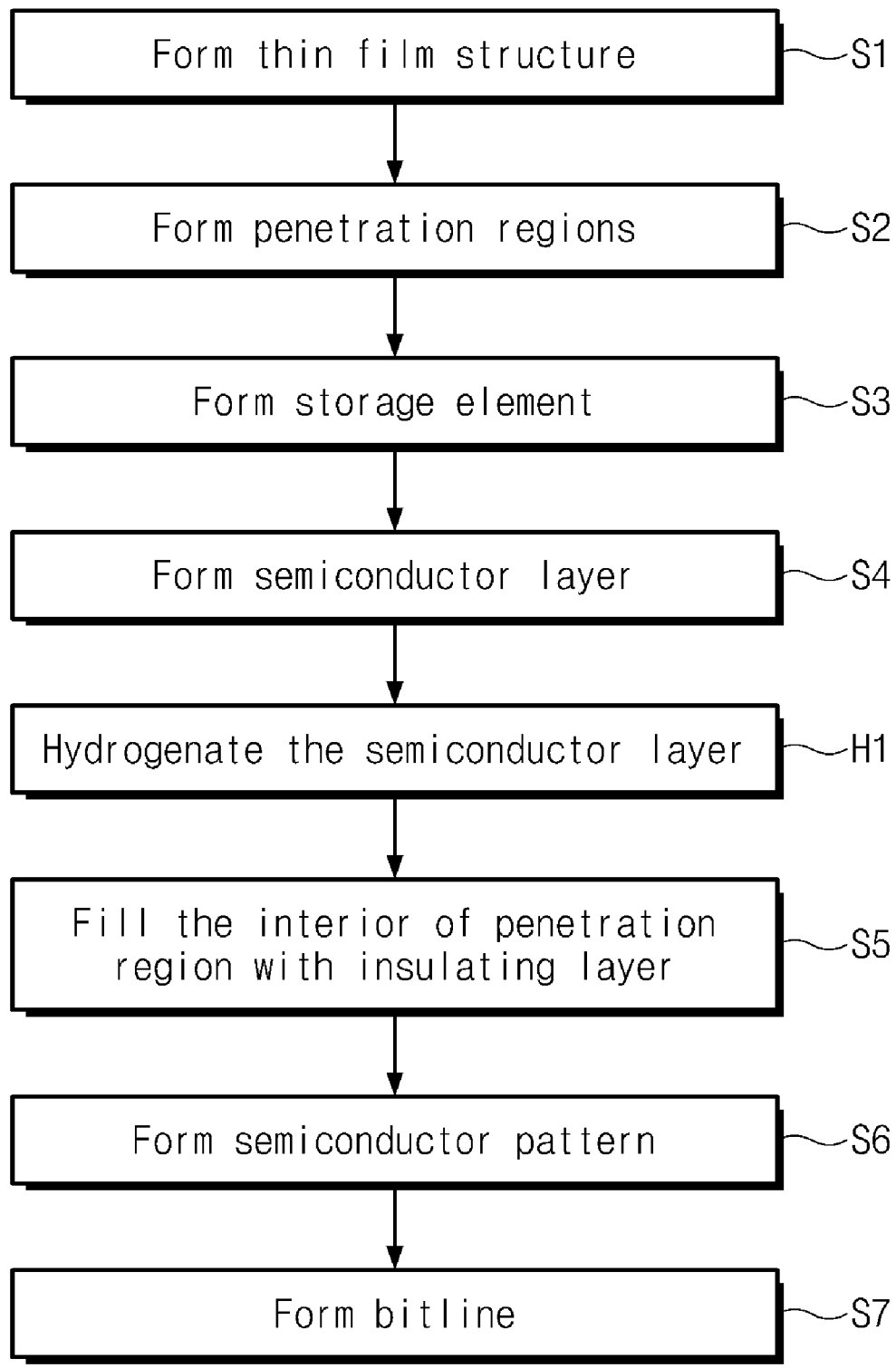
FIGS. 10A to 10C are flowcharts illustrating a method for fabricating a semiconductor memory device according to an embodiment of the inventive concept.

A method for fabricating a semiconductor memory device according to an embodiment of the inventive concept will now be described below in detail with reference to FIGS. 2 to 9. FIG. 10A is a flowchart illustrating a method for fabricating a semiconductor memory device according to an embodiment of the inventive concept.

Figure 2:
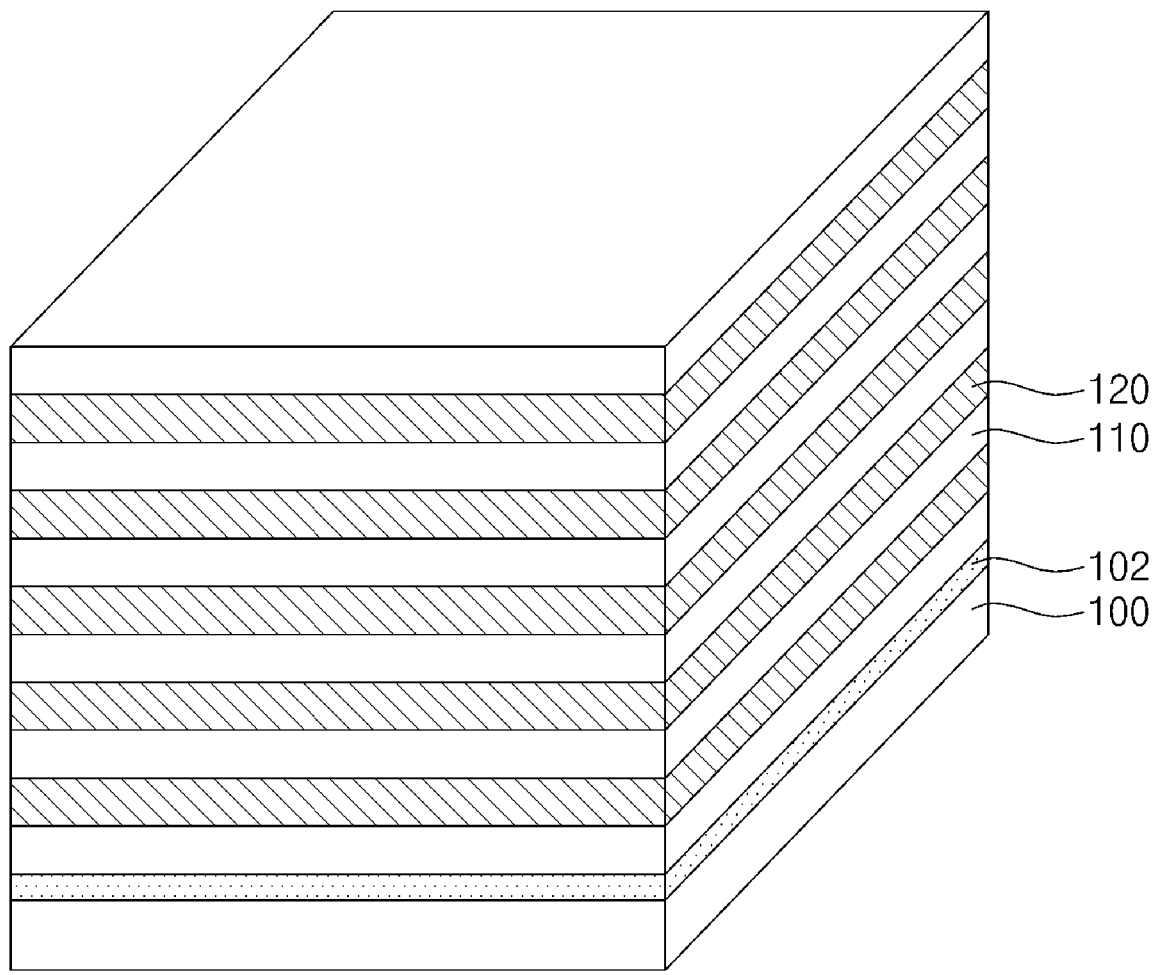
FIGS. 2 to 9 illustrate a method for fabricating a semiconductor memory device according to an embodiment of the inventive concept.

Referring to FIGS. 2 and 10A, an impurity region 102 is formed on a semiconductor substrate 100. The semiconductor substrate 100 may be formed of single-crystalline silicon or a semiconductor material providing different semiconductor characteristics.

A thin film structure comprising a plurality of stacked thin films is formed on the semiconductor substrate 100 (S1). Forming the thin film structure may include forming alternately stacked first and second material layers 110 and 120 repeatedly twice or more times. That is, the thin film structure may include a plurality of sequentially stacked first material layers 110 and a plurality of second material layers 120 interposed therebetween. The first material layers 110 may be formed of an insulating material (e.g., silicon oxide or silicon nitride), and the second material layer 120 may be formed of a conductive material (e.g., doped polysilicon or metallic material).

Figure 3:
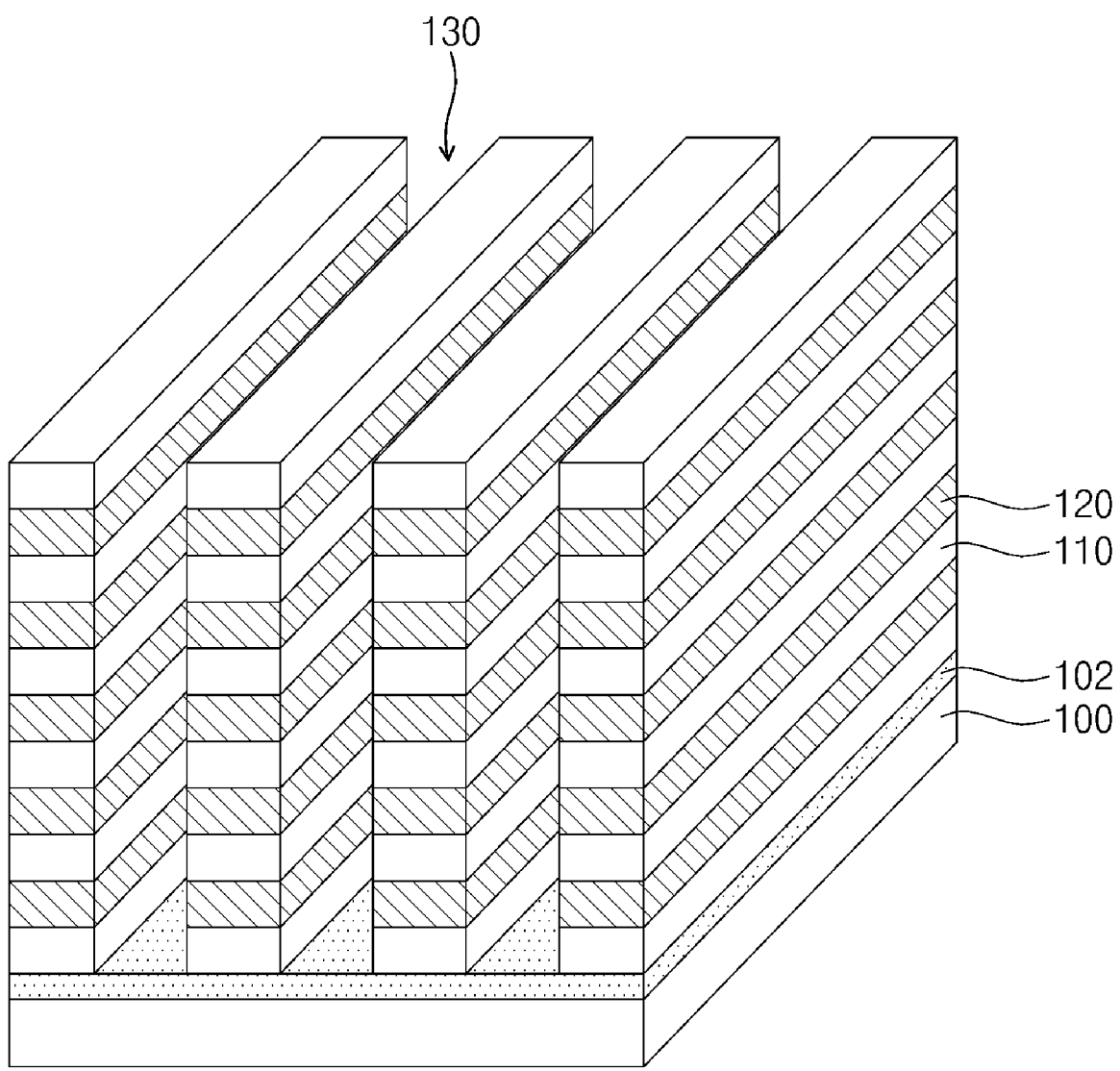

Referring to FIGS. 3 and 10A, the thin film structure is patterned such that a plurality of penetration regions 130 are formed to expose a top surface of the impurity region 102 (S2).

More specifically, forming the penetration regions 130 includes forming a mask pattern (not shown) on the thin film structure to define planar positions of the penetration regions 130 and anisotropically etching the thin film structure by using the mask pattern as an etch mask. The penetration regions 130 may be formed two-dimensionally and regularly. For instance, the positions of the penetration regions 130 may be described by a coordinate set $(x0+n*a, y0+m*b)$ (wherein $x0$ and $y0$ represent the coordinates of a reference point, $n$ and $m$ represent positive integers selected within the size of a cell array, and $a$ and $b$ represent constants).

According to an embodiment, the penetration region 130 may be a trench which is formed to expose a top surface of the impurity region 102 and has a rectangular bottom surface, as shown in FIG. 3. Due to the trench-type penetration regions 130, each of the first and second material layers 110 and 120 may include a plurality of lines having a sidewall defined by a trench. Among lines defined by the penetration region 130, lowermost lines may be used as a ground select line and uppermost lines may be used as a string select line.

Figure 8:
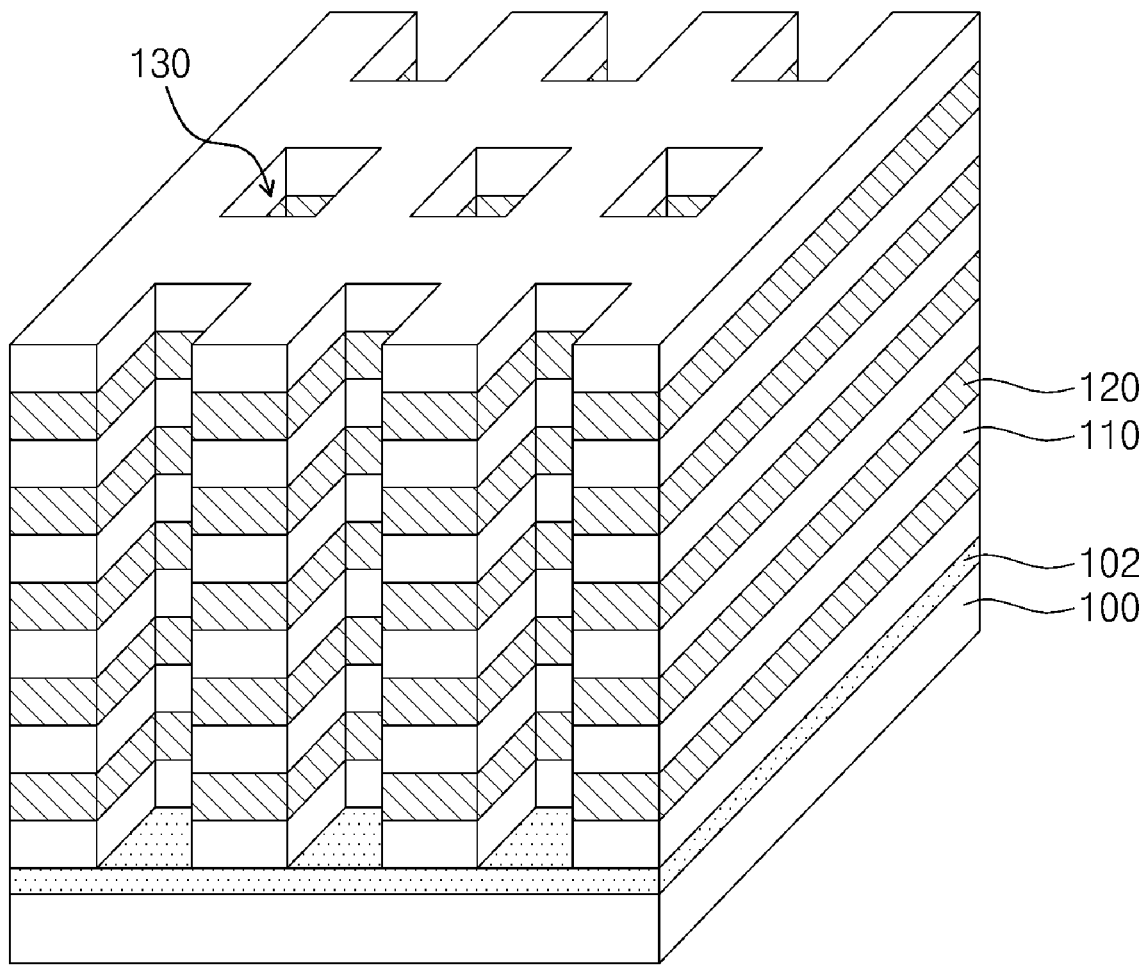

According to another embodiment, the penetration region 130 may be a cylindrical or rectangular parallelepiped hole, as shown in FIG. 8. Due to the cylindrical hole, each of the first and second material layers 110 and 120 may have a mesh shape.

Figure 4:
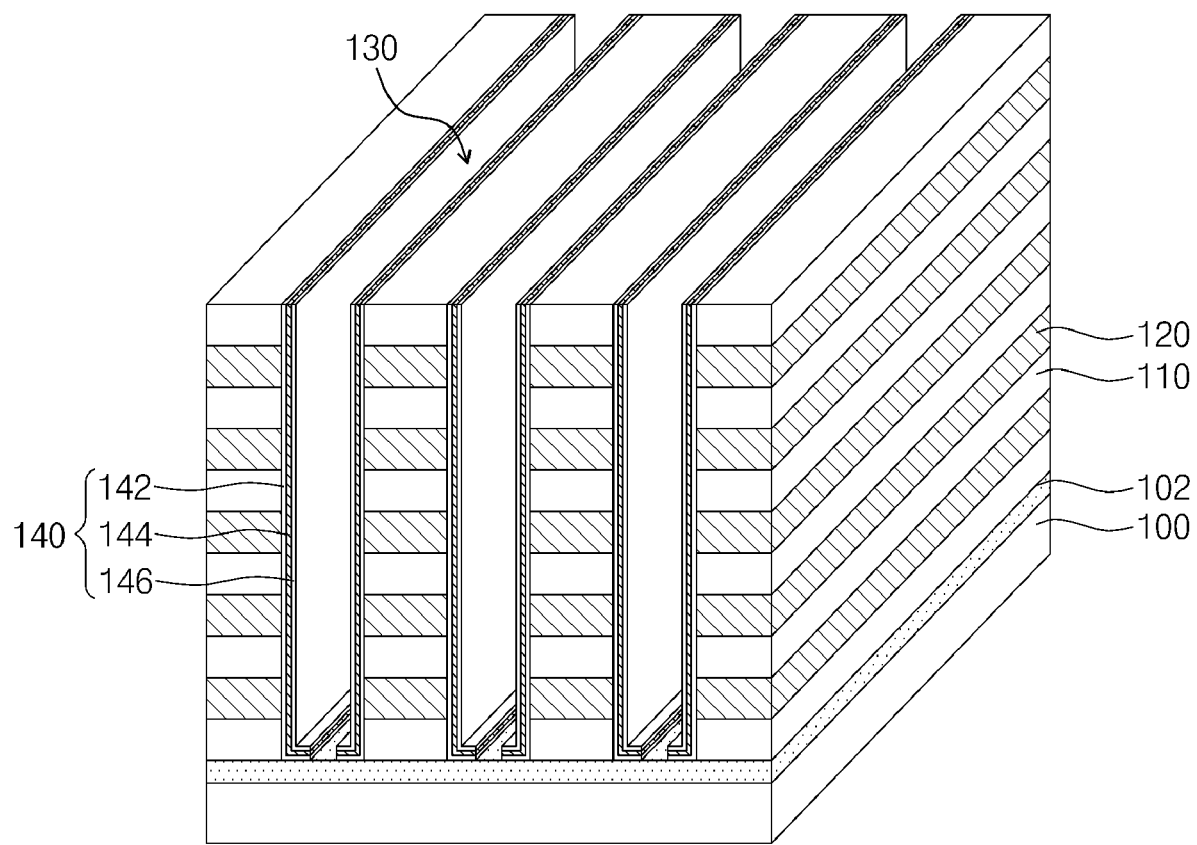

Referring to FIGS. 4 and 10A, an element 140 including at least one thin film for data storage (hereinafter referred to as "storage element") is formed in the penetration regions 130 (S3). According to an embodiment, the storage element 140 may be formed to cover an inner wall of the penetration region 130.

The storage element 140 may be a thin film structure for charge storage. According to an embodiment, the storage element 140 may include a first insulating layer 142, a charge storage film 144, and a second insulating layer 146 which are formed to sequentially cover the inner wall of the penetration region 130. Each of the first and second insulating layers 142 and 146 may be at least one of a silicon oxide layer, a silicon nitride layer, a silicon oxynitride layer, and a high-k dielectric layer (e.g., an aluminum oxide layer or a hafnium oxide layer). The charge storage film 144 may be at least one of a charge-trap-site-rich insulating thin film such as a silicon nitride layer, an insulating thin film including nano dots, and a conductive thin film which may be locally patterned to function as a floating electrode. However, the storage element 140 according to the inventive concept is not limited to the foregoing thin film for charge storage and may be a thin film capable of storing data based on another operation principle (e.g., a thin film for a variable resistance memory).

Forming the storage element 140 may include conformally forming a data storage film along a surface of a structure where the penetration regions 130 are formed and patterning the data storage film. Conformally forming the data storage film may be done by means of a film formation process for forming a film having excellent step coverage such as a thermal oxidation process or a chemical vapor deposition (CVD) process. In this case, the data storage film may be formed to conformally cover the sidewall of the penetration region 130 and the top surface of the impurity region 102.

Patterning the data storage film may include etching the data storage film such that a storage element 140 is formed to expose the top surface of the impurity region 102. For instance, patterning the data storage film may include locally removing the data storage film from the top surface of the impurity region 102 by means of an anisotropic etching process.

According to an embodiment, before etching the data storage film, the method may further include forming a passivation layer (not shown) to conformally cover a surface of the data storage film. In this case, etching the data storage film may include etching the passivation layer and the data storage film to expose the top surface of the impurity region 102. The passivation layer may prevent the data storage film from being damaged during the anisotropic etching process. The passivation layer may be removed after forming the data storage layer 140.

Figure 5:
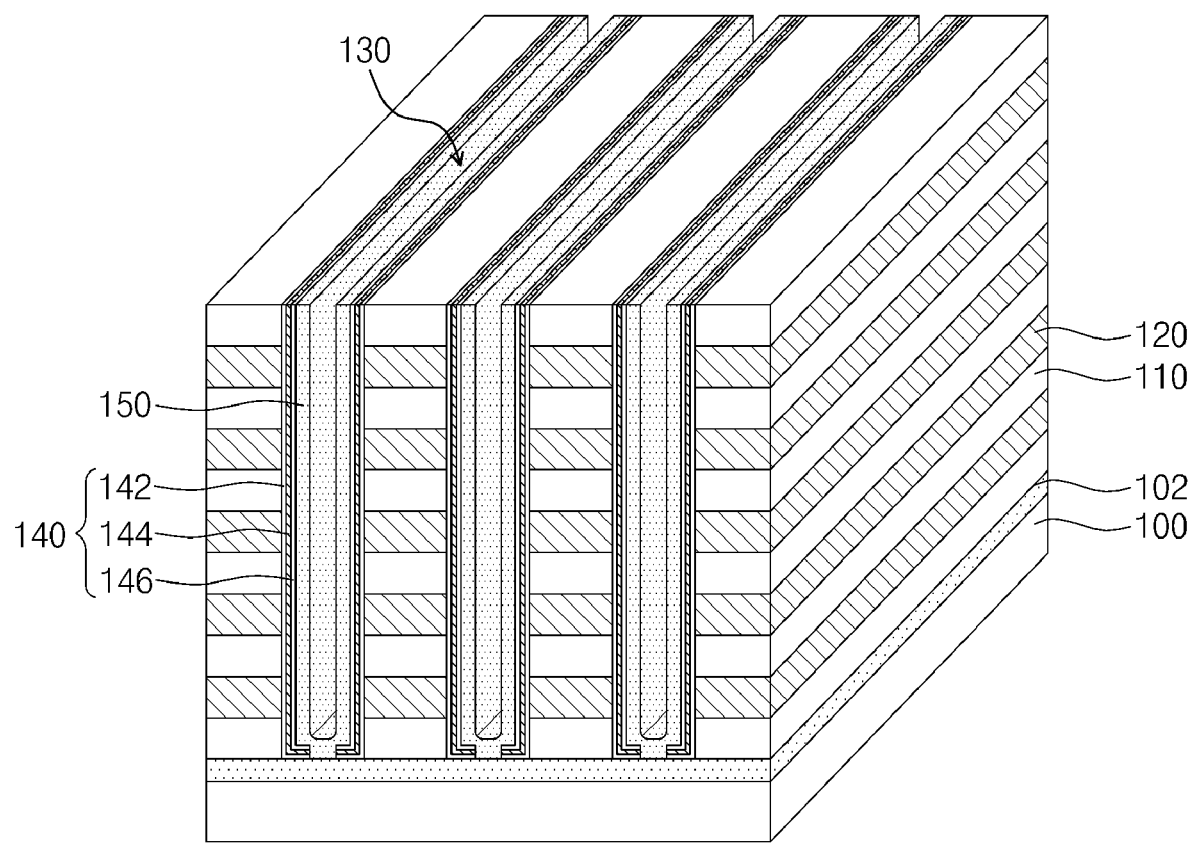

Referring to FIGS. 5 and 10A, a semiconductor layer 150 is formed in the penetration region 130 (S4). The semiconductor layer 150 covers the storage element 140 and is in contact with the top surface of the semiconductor substrate 100.

The semiconductor layer 150 may be formed by means of a CVD process or an atomic layer deposition (ALD) process. Alternatively, the semiconductor layer 150 may be formed by means of a selective epitaxial growth (SEG) process using the impurity region 102 exposed by the penetration region 130 as a seed layer. Alternatively, the semiconductor layer 150 may be formed by means of a laser-induced epitaxial growth (LEG) process where an amorphous semiconductor layer is grown in the penetration region 130 and leaser beam such as excimer laser is irradiated to the grown semiconductor layer to crystallize the semiconductor layer.

The semiconductor layer 150 may be formed of polycrystalline or single-crystalline silicon. A discontinuous boundary surface may be formed between the semiconductor substrate 100 and the semiconductor layer 150.

As shown in FIG. 5, the semiconductor layer 150 may be conformally formed on the inner wall of the penetration region 130. That is, the semiconductor layer 150 may be formed to have a cylindrical shape or a shell shape. According to another embodiment, the semiconductor layer 150 may be formed to fill the interior of the penetration region 150, as shown in FIG. 9. That is, the semiconductor layer 150 may be formed to have a pillar shape.

Figure 6:
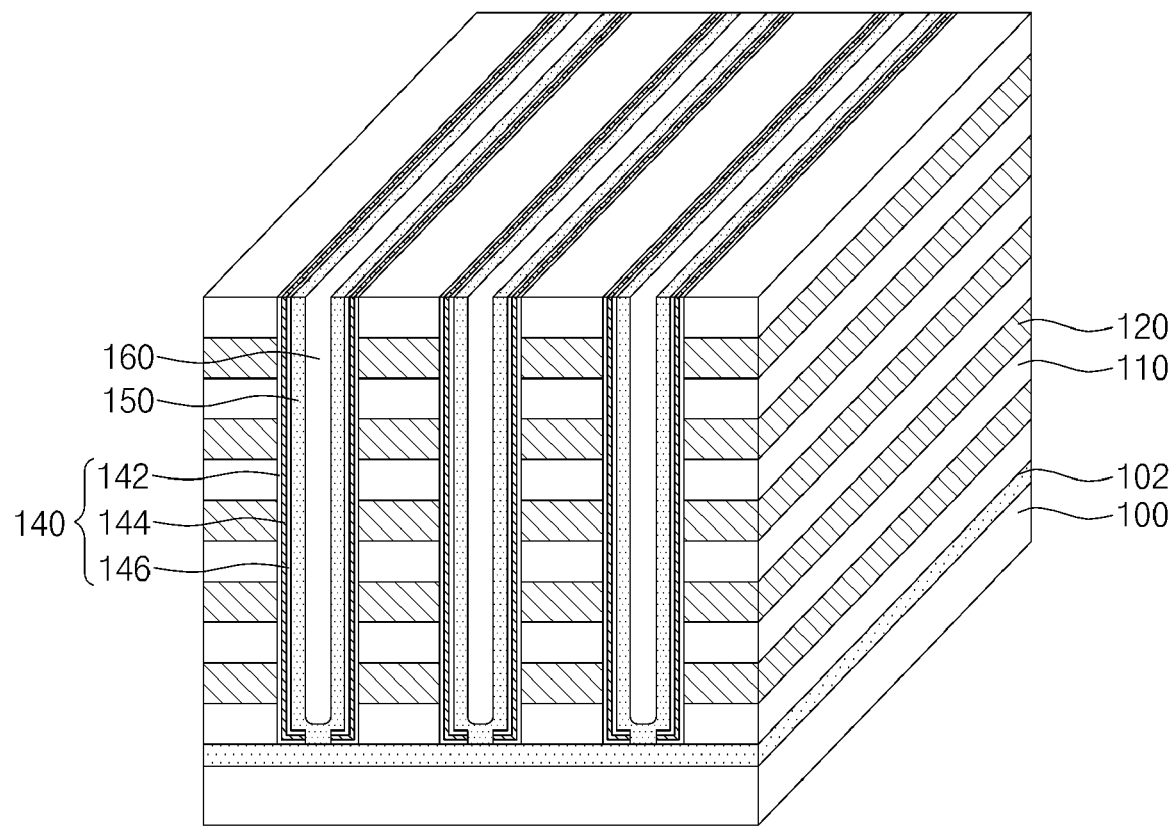

Referring to FIGS. 6 and 10A, a filling layer 160 is formed to fill the interior of the penetration region where the semiconductor layer 150 is formed (S5). Semiconductor layers 150 are patterned to form a semiconductor layer pattern 152. That is, isolation regions (not shown) are formed to turn the semiconductor layers 150 into two-dimensionally arranged pillars. A gap-fill insulating layer (not shown) may be formed to fill interiors of the isolation regions. The gap-fill insulating layer is desirably formed of silicon oxide, but is not limited thereto and may be formed of at least one of other various insulating materials.

Forming the semiconductor pattern 152 (S6) may include forming a mask pattern in a direction crossing the penetration region 130 to expose the semiconductor layers 150 and anisotropically etching the semiconductor layers by using the mask pattern as an etch mask.

Figure 7:
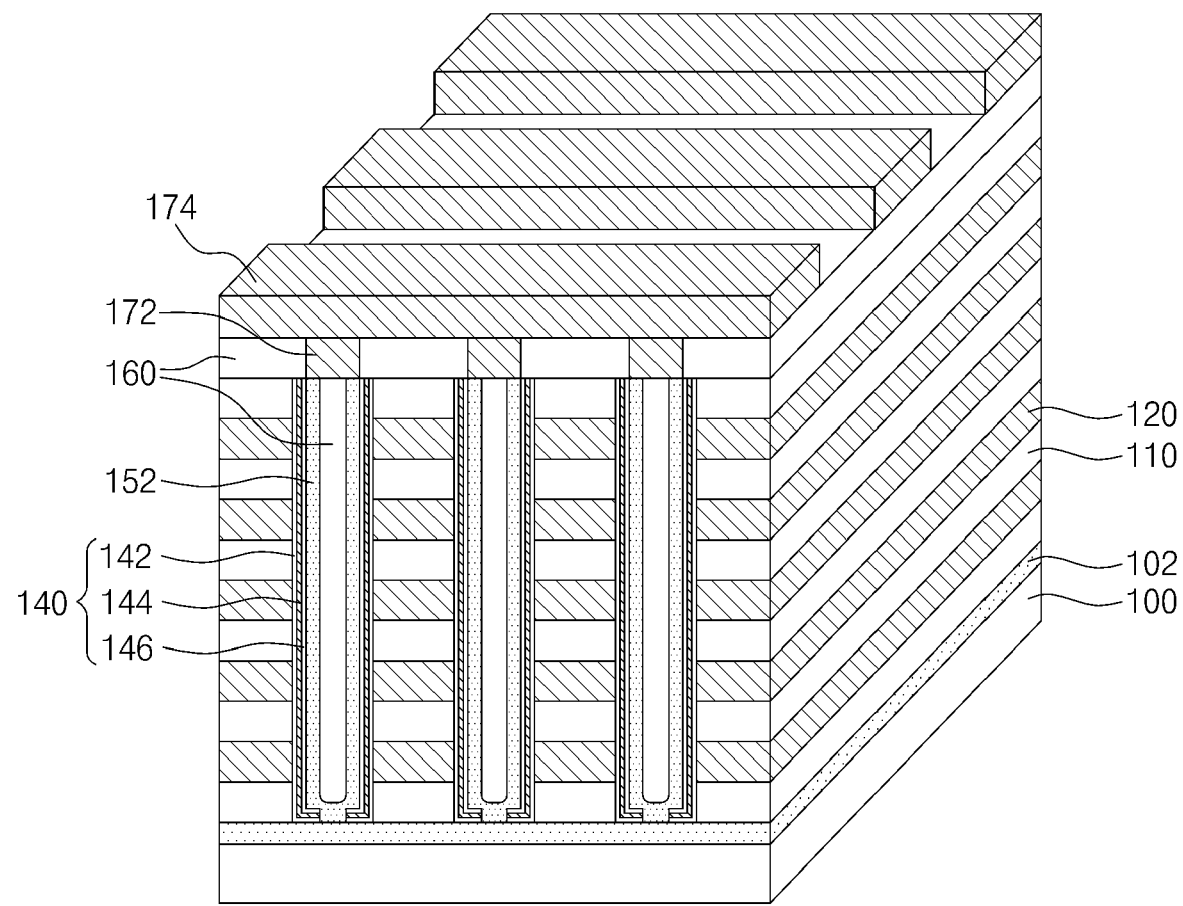

Referring to FIGS. 7 and 10A, upper select lines are formed by filling isolation regions with insulating materials, forming conductive materials thereon, and patterning the conductive materials. Each of the upper select lines is formed to one-dimensionally connect a semiconductor pattern 152.

Bitlines 174 are formed to be electrically connected to the semiconductor pattern 150 (S7). More specifically, the bitlines may be formed by forming an upper interlayer filling layer 160, forming via plugs 172 to be connected to the semiconductor pattern 150 through the upper interlayer filling layer 160, forming a conductive layer thereon, and patterning the conductive layer. The bitlines 174 are formed in a direction crossing the upper select lines.

According to an embodiment, the semiconductor layer 150 used as a channel of a memory cell and select transistors may be formed of a polycrystalline semiconductor material. In the case that the semiconductor layer 150 is formed of a polycrystalline semiconductor material, potential change occurs at individual grain boundaries of the polycrystalline semiconductor material. That is, potential change occurs between grains of the semiconductor layer 150. Thus, the potential change at the grain boundaries may act as a potential barrier during charge migration from a grain to another grain. As a result, mobility of the charges in the semiconductor layer 150 may be reduced. Moreover, in the case where the semiconductor layer 150 is formed of a polycrystalline semiconductor material, crystalline defect may occur at the boundary between the semiconductor layer 150 and the second insulating layer 146. For instance, stable bonding between silicon and oxygen may be damaged to cause dangling bond of —Si—O or —Si— at the surface of the silicon. Due to the dangling bond, hot electrons are generated on the semiconductor layer 150. The hot electrons may be trapped into a second insulating layer (i.e., silicon oxide layer) 146. That is, trap sites may exist between the second insulating layer 146 and the semiconductor layer 150. Thus, mobility of charges may be reduced between the data storage film 144 and the semiconductor layer 150 during the operation of a nonvolatile memory device.

For this reason, after being formed in a penetration region, a semiconductor layer is post-treated with a post-treatment material containing hydrogen or deuterium, as shown in FIG. 10A. That is, the semiconductor layer is hydrogenated (H1). Hydrogenating the semiconductor layer may include providing hydrogen ions generated from the post-treatment material to the semiconductor layer. Post-treating the semiconductor layer may include generating hydrogen ions or deuterium ions from a post-treatment material by performing an annealing treatment or a plasma treatment in hydrogen ambient. Post-treating the semiconductor layer may include providing a process gas containing at least one of $H_2$, $H_2O$, $D_2O$, and $NH_3$ to the semiconductor layer.

When an annealing treatment or a plasma treatment is performed in a hydrogen ambient, hydrogen ions may be permeated and diffused into the semiconductor layer 150 exposed to the penetration region 130 to bond crystalline defect of the semiconductor layer 150 to the hydrogen ions or deuterium ions. Thus, trap sites caused by the crystalline defect at the semiconductor layer 15 may be removed and the potential change between the grains of the semiconductor layer 150 may be reduced. As a result, mobility of the charges at the semiconductor layer 150 used as a channel of a memory cell and select transistors may be improved.

Figure 10B:
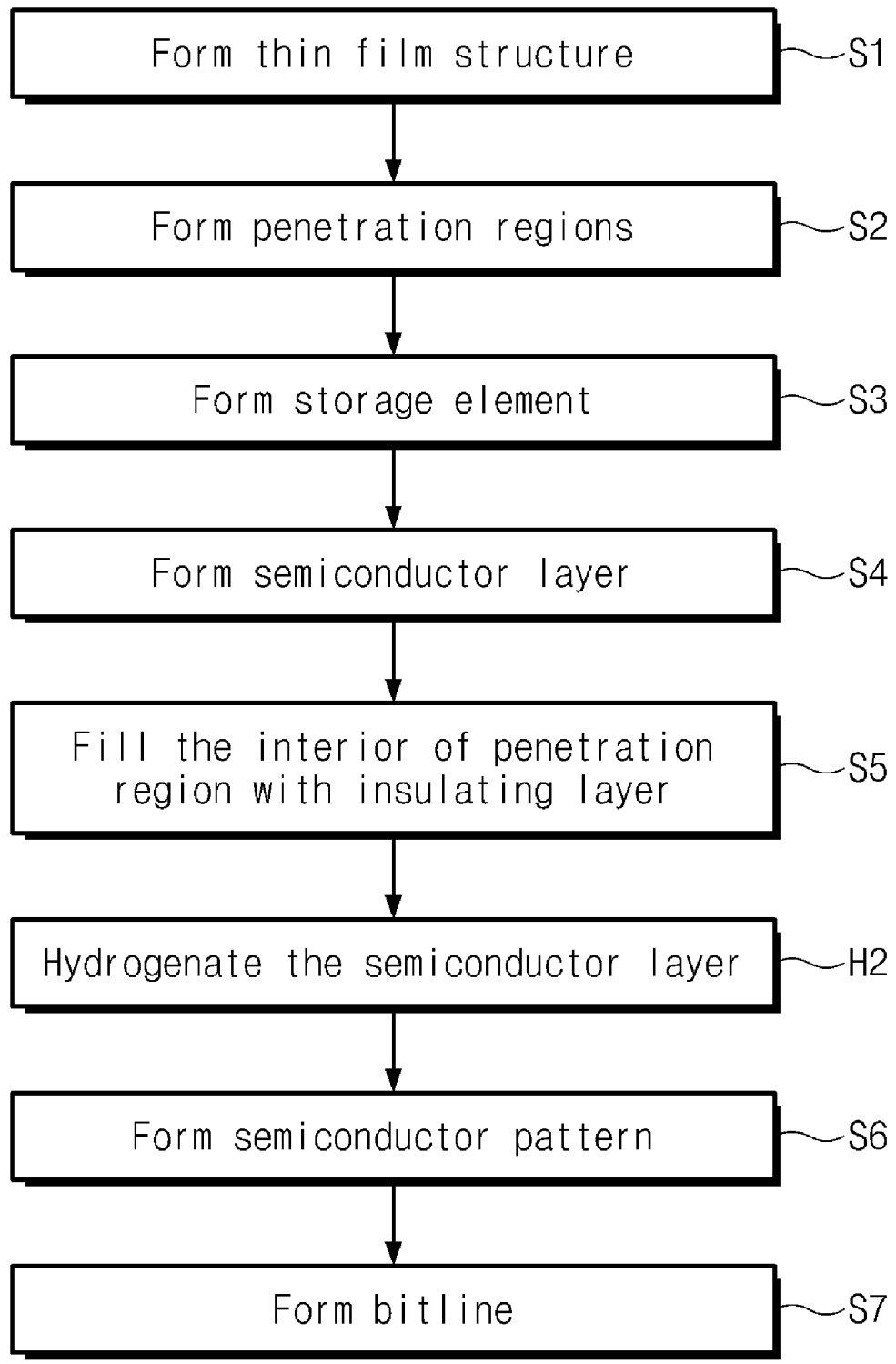

According to another embodiment, hydrogenating the semiconductor layer may be done after a filling layer fills the interior of a penetration region where the semiconductor layer is formed (H2), as shown in FIG. 10B. That is, the semiconductor layer 150 may be hydrogenated while not being exposed to hydrogen ambient.

Figure 10C:
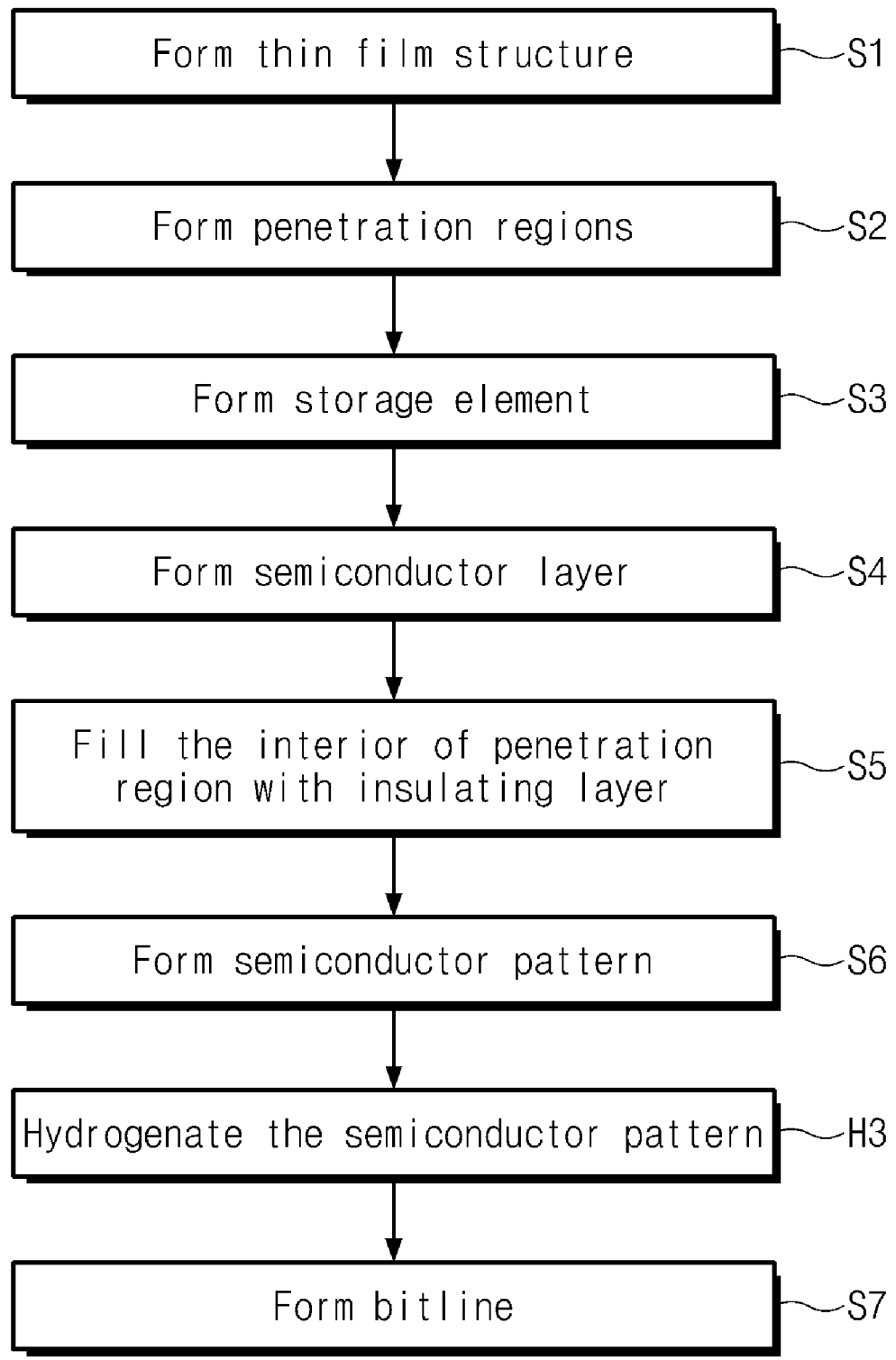

According to another embodiment, a semiconductor pattern may be hydrogenated after formation of the same (H3), as shown in FIG. 10C.

As set forth with reference to FIGS. 10A to 10C, hydrogenating a semiconductor layer is done once during processes of fabricating a semiconductor memory device according to the foregoing embodiments. However, hydrogenating a semiconductor layer is not limited to the foregoing embodiments and may be done once or more times.

According to an embodiment, a filling layer 160 filling the penetration region 130 may be a hydrogen-rich containing layer, which may be a source supplying hydrogen ions to a semiconductor layer. That is, a filling layer 160 contacting the semiconductor layer 150 may supply hydrogen ions or deuterium ions to the semiconductor layer 150 during a high-temperature annealing process. In addition, the filling layer 160 may prevent dissociation of hydrogen atoms bonded to silicon at the hydrogenated semiconductor layer 150. The filling layer 160 may be formed using SiH4 gas and contain a large amount of hydrogen atoms during its formation. For instance, a hydrogen supply layer may be formed of at least one of SOG materials, hydrogen-rich oxide (e.g. PE-oxide, HDP oxide), hydrogen-rich nitride, and hydrogen-rich oxynitride.

A method for fabricating a semiconductor memory device according to another embodiment of the inventive concept will now be described below in detail with reference to FIGS. 11 to 19 and FIG. 20A.

FIGS. 11 to 19 illustrate a method for fabricating a semiconductor memory device according to another embodiment of the inventive concept. FIG. 20A is a flowchart illustrating a method for fabricating a semiconductor memory device according to another embodiment of the inventive concept.

Figure 11:
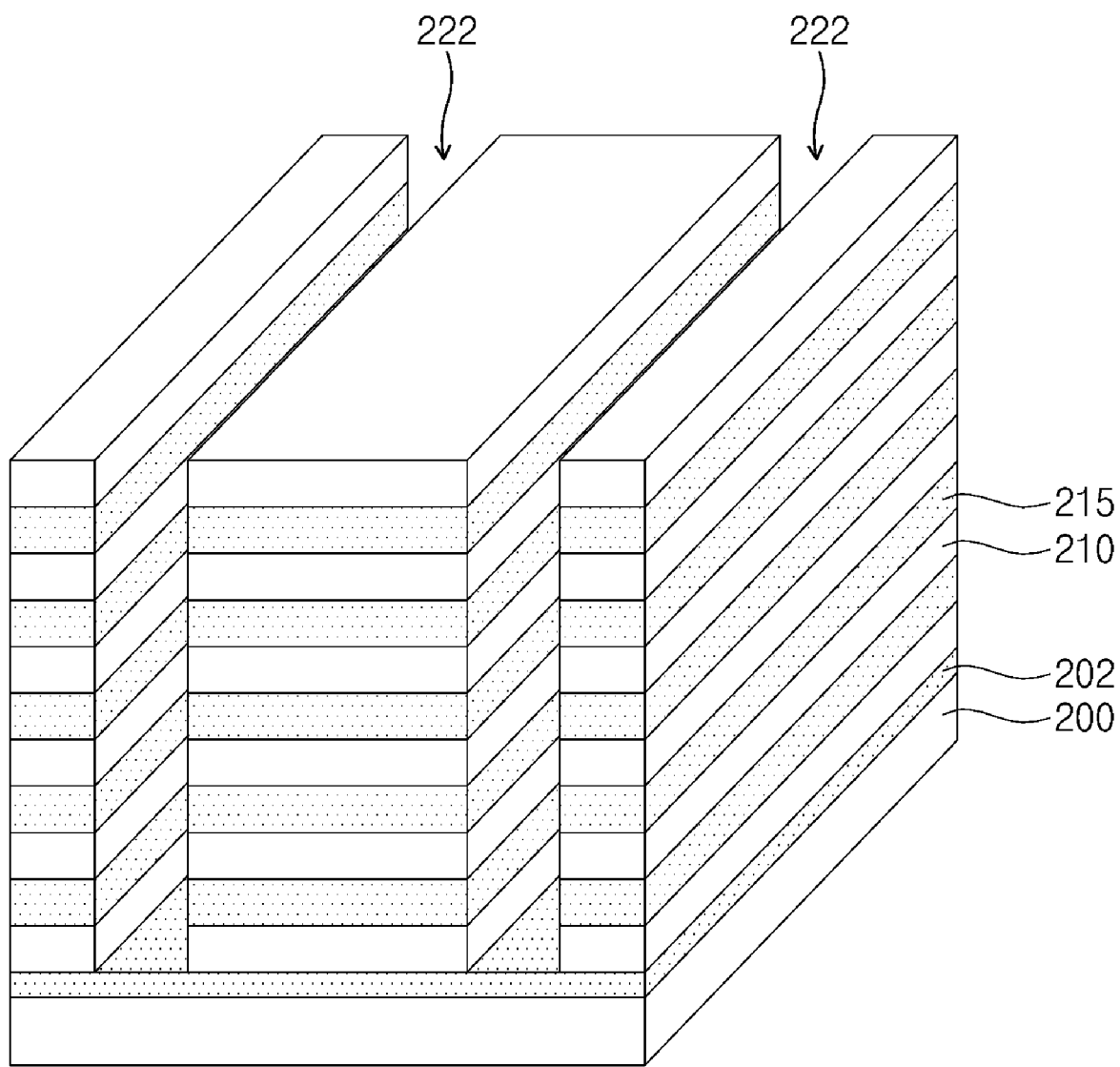
FIGS. 11 to 19 illustrate a method for fabricating a semiconductor memory device according to another embodiment of the inventive concept.

Referring to FIGS. 11 and 20A, a thin film structure comprising a plurality of stacked thin films is formed on a semiconductor substrate 200 (S10). Forming the thin film structure may be substantially identical to that in the foregoing embodiment. According to this embodiment, the thin film structure may include a plurality of sequentially stacked first material layers 210 and a plurality of second material layers 215 interposed therebetween. The first and second material layers 210 and 215 may be formed of insulating materials having different wet-etch rates. For instance, the first material layer 210 may be formed of silicon oxide and the second material layer 215 may be formed of silicon nitride.

After the thin film structure is formed, it is patterned such that a plurality of first penetration regions 222 are formed to expose a top surface of the impurity region 202 (S20). Forming the first penetration regions 222 may include forming a mask pattern (not shown) on the thin film structure to define planar positions of the first penetration regions 222 and anisotropically etching the thin film structure by using the mask pattern as an etch mask. According to an embodiment, the first penetration region 222 may be a trench which is formed to expose a top surface of the impurity region 202 and has a rectangular bottom surface. According to another embodiment, the first penetration regions 222 may be formed to have a cylindrical hole shape, as shown in FIG. 8.

Figure 12:
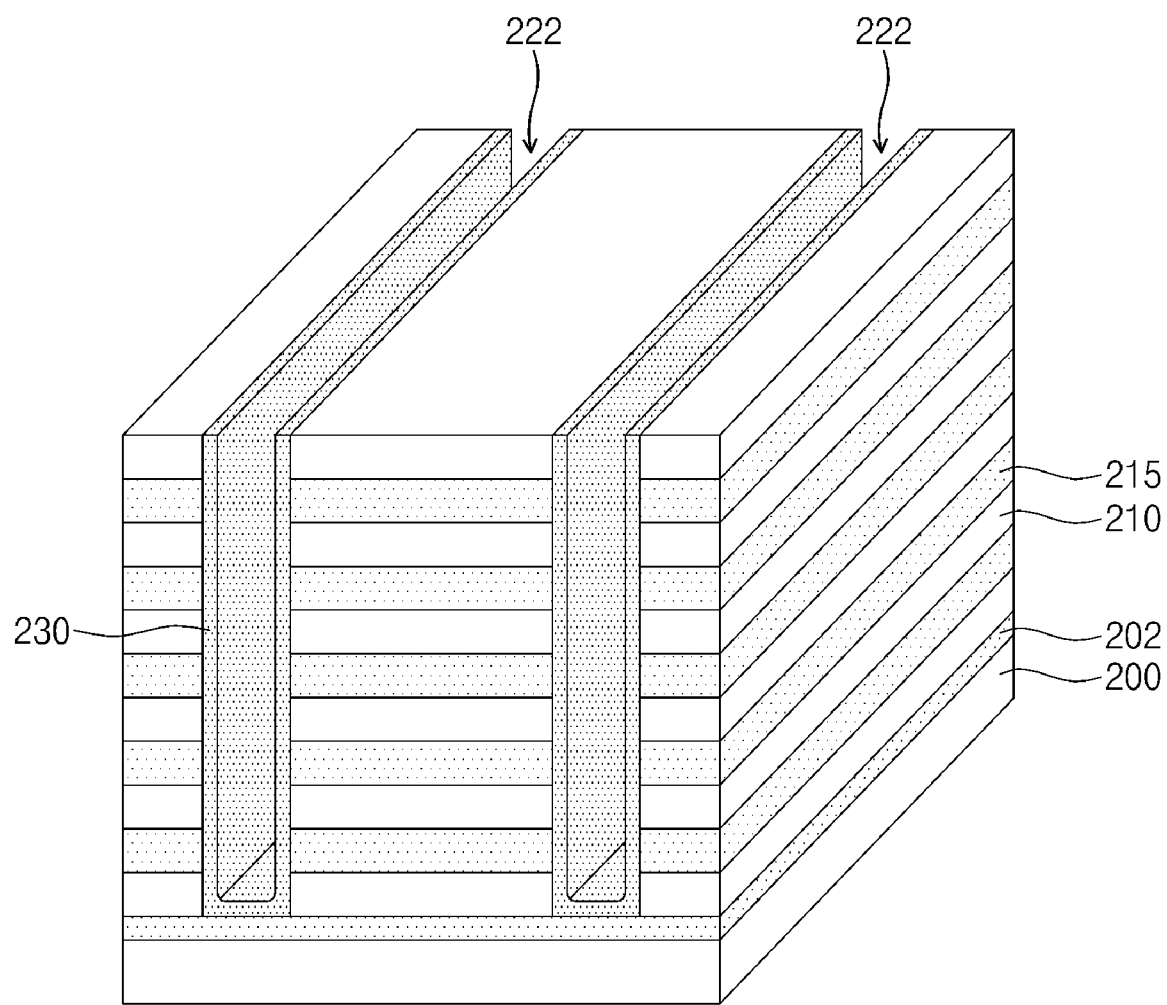

Referring to FIGS. 12 and 20A, a semiconductor layer 230 is formed to cover an inner wall of the first penetration region 222 and to be in contact with a top surface of the semiconductor substrate 200 (S30).

The semiconductor layer 230 may be formed by means of a CVD or ALD process. Alternatively, the semiconductor layer 230 may be formed by means of a selective epitaxial growth (SEG) process using the impurity region 102 exposed by the penetration region 130 as a seed layer. Alternatively, the semiconductor layer 230 may be formed by means of a laser-induced epitaxial growth (LEG) process where an amorphous semiconductor layer is grown in the penetration region 130 and leaser beam such as excimer laser is irradiated to the grown semiconductor layer to crystallize the semiconductor layer.

The semiconductor layer 230 may be formed of polycrystalline or single-crystalline silicon. A discontinuous boundary surface may be formed between the semiconductor substrate 100 and the semiconductor layer 230.

As shown in FIG. 5, the semiconductor layer 230 may be conformally formed on the inner wall of the first penetration region 222. That is, the semiconductor layer 230 may be formed to have a cylindrical shape or a shell shape. According to another embodiment, the semiconductor layer 230 may be formed to have a pillar shape which fills the interior of the first penetration region 222.

Figure 13:
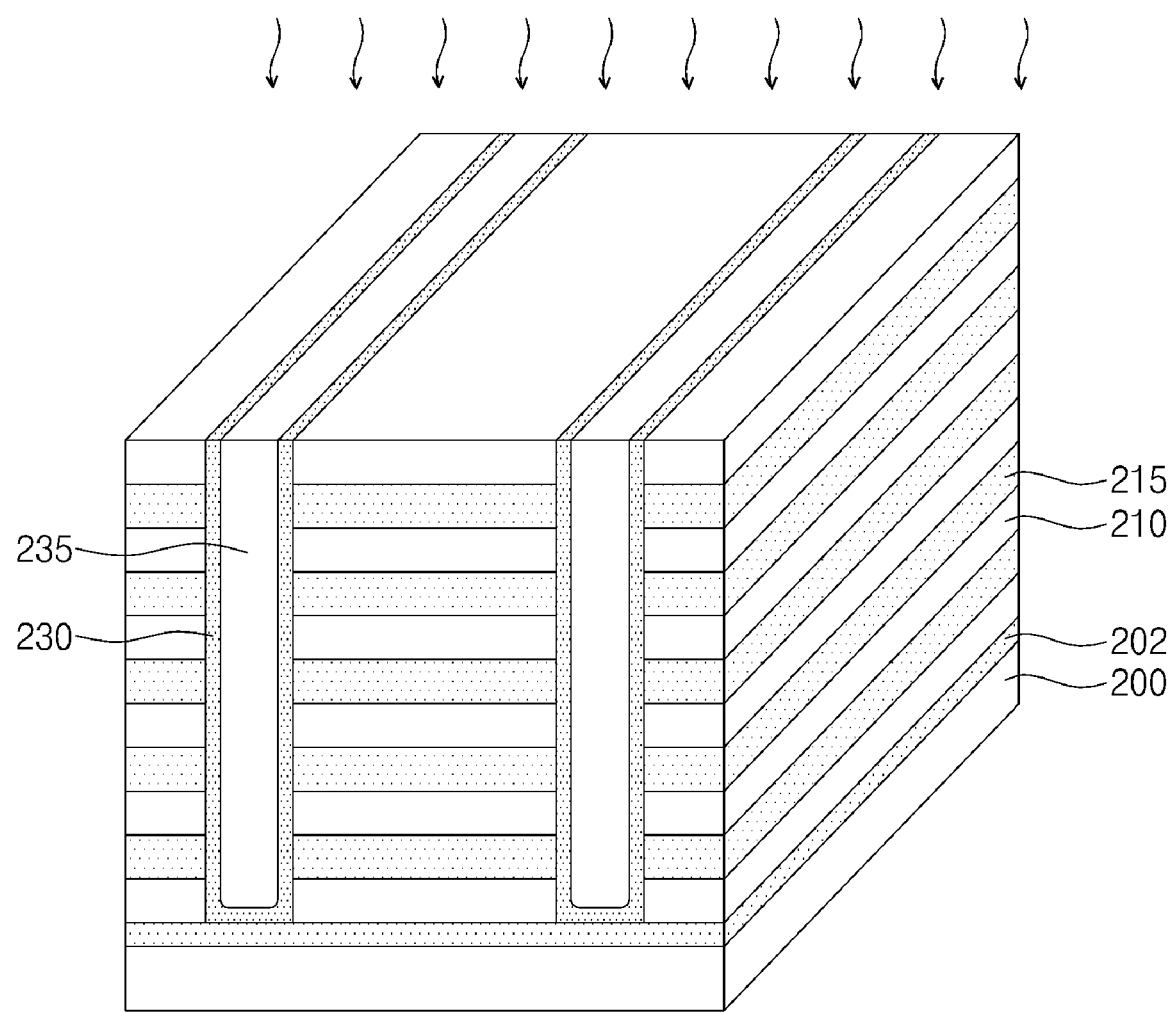

Referring to FIGS. 13 and 20A, after formation of the semiconductor layer 230, a filling layer 235 is formed to fill the interior of the first penetration region 222 (S40). The filling layer 235 may be formed by performing a deposition process to fully fill the first penetration region 222 and planarizing an upper portion of the resultant structure.

Figure 14:
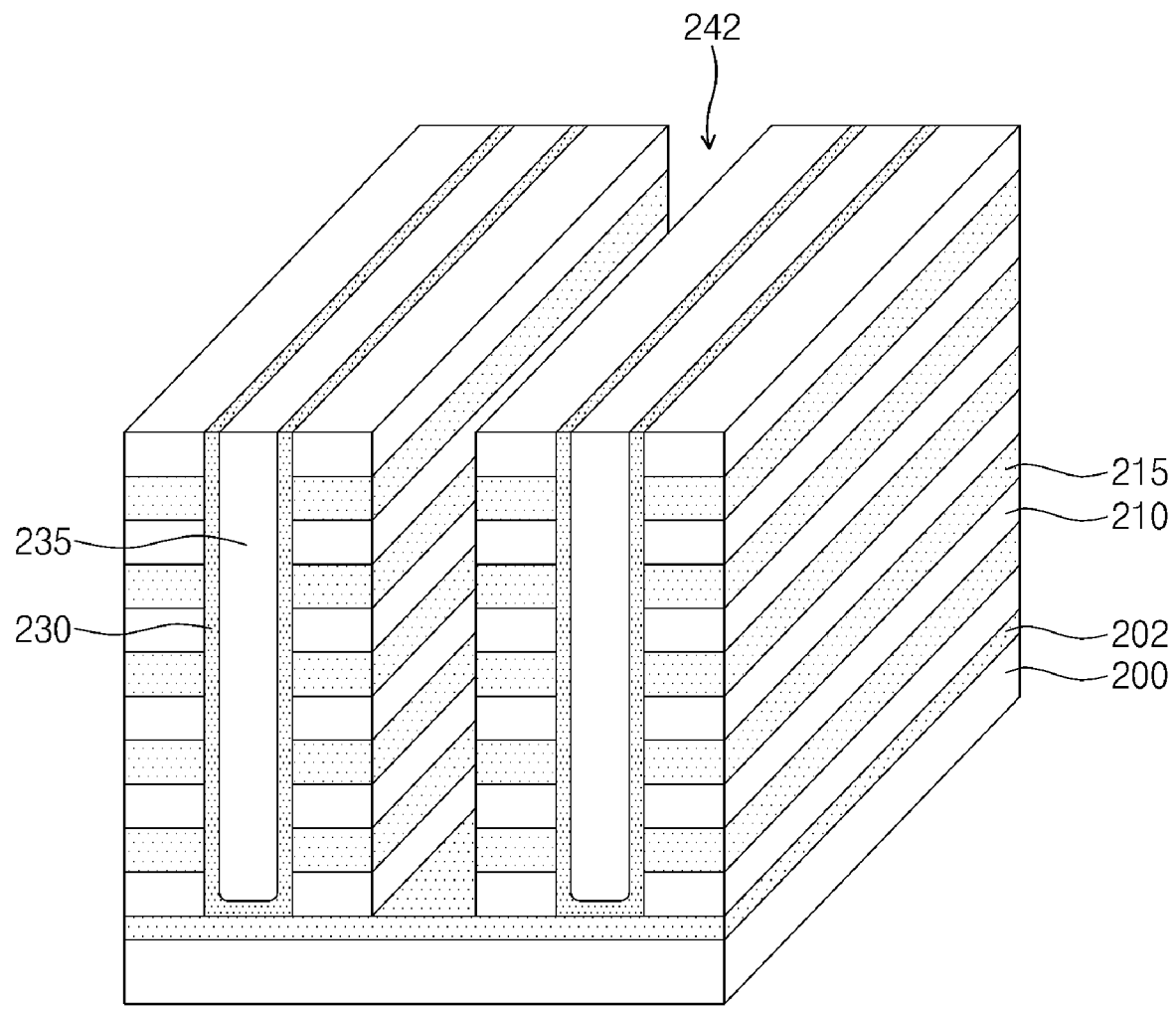

Referring to FIGS. 14 and 20A, by patterning the thin film structure where the semiconductor layer 230 is formed, second penetration regions 242 are formed to expose the impurity region 202 (S50).

Forming the second penetration regions 242 may include forming a mask pattern (not shown) on the thin film structure to define planar positions of the second penetration regions 242 and anisotropically etching the thin film structure by using the mask pattern as an etch mask.

The second penetration region 242 may be formed to expose a top surface of an impurity region. In addition, the second penetration regions 242 may be formed in line type between the first penetration regions 222 where the semiconductor layer 230 is formed and may be formed in parallel to the first penetration regions 222. Since the first and second penetration regions 222 and 242 are formed in parallel to each other, the first and second material layers 210 and 215 stacked on the semiconductor substrate 200 may be patterned in line type. That is, a plurality of lines having sidewalls defined by the first and second penetration regions 222 and 242 may be formed. Among the lines formed by the first and second penetration regions 222 and 242, lowermost lines may be used as ground select lines and uppermost lines may be used as string select lines.

Figure 15:
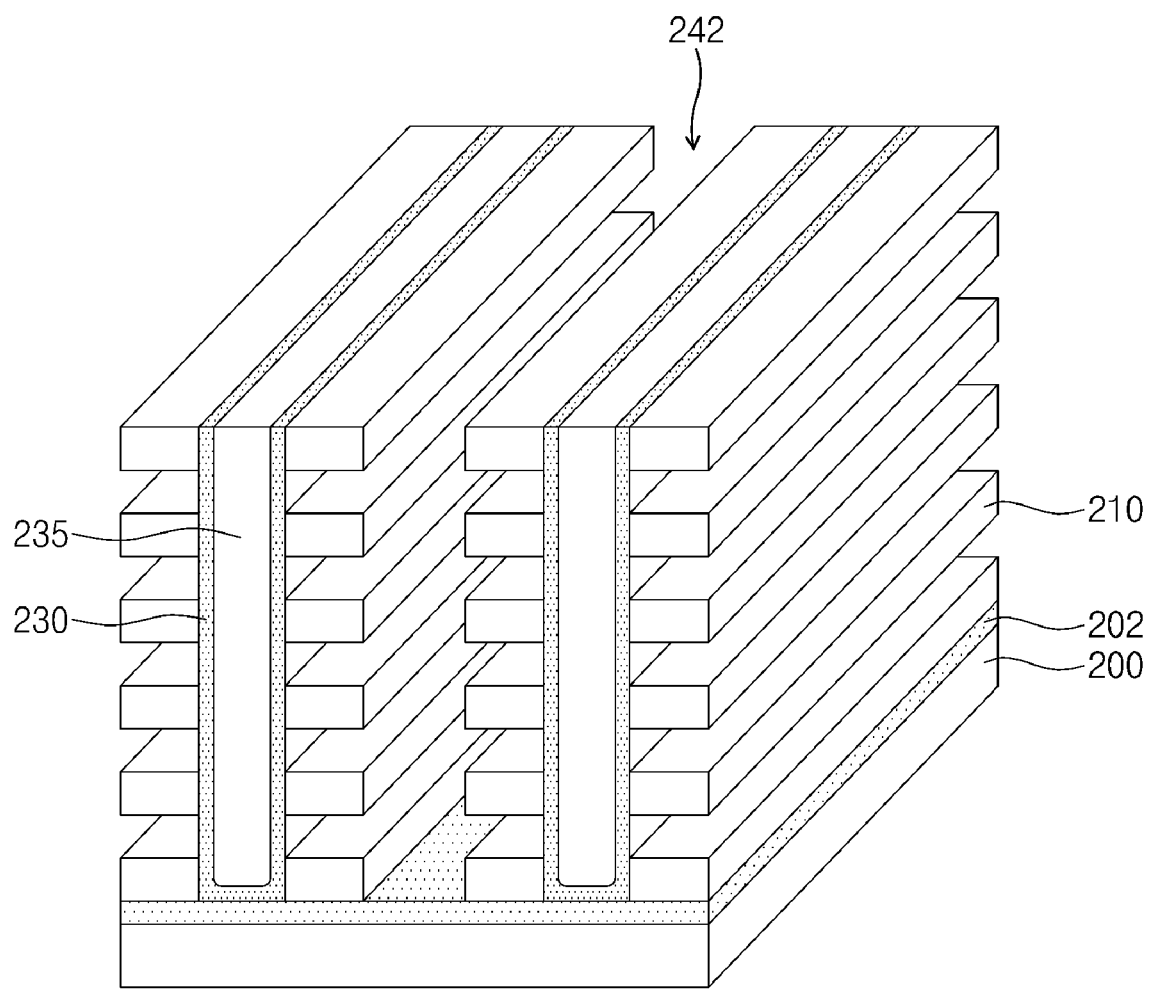

Referring to FIGS. 15 and 20A, the second material layers 215 exposed by the second penetration region 242 is removed. Thus, an empty space may be formed between the stacked first insulating layers 210 to expose the sidewall of the semiconductor layer 230.

Removing the second material layers 215 may be done using an etch recipe having an etch selectivity with respect to the first material layer 210 and the semiconductor layer 230. For instance, the second material layers 215 may be removed using an etchant capable of wet-etching the second material layers 215.

Figure 16:
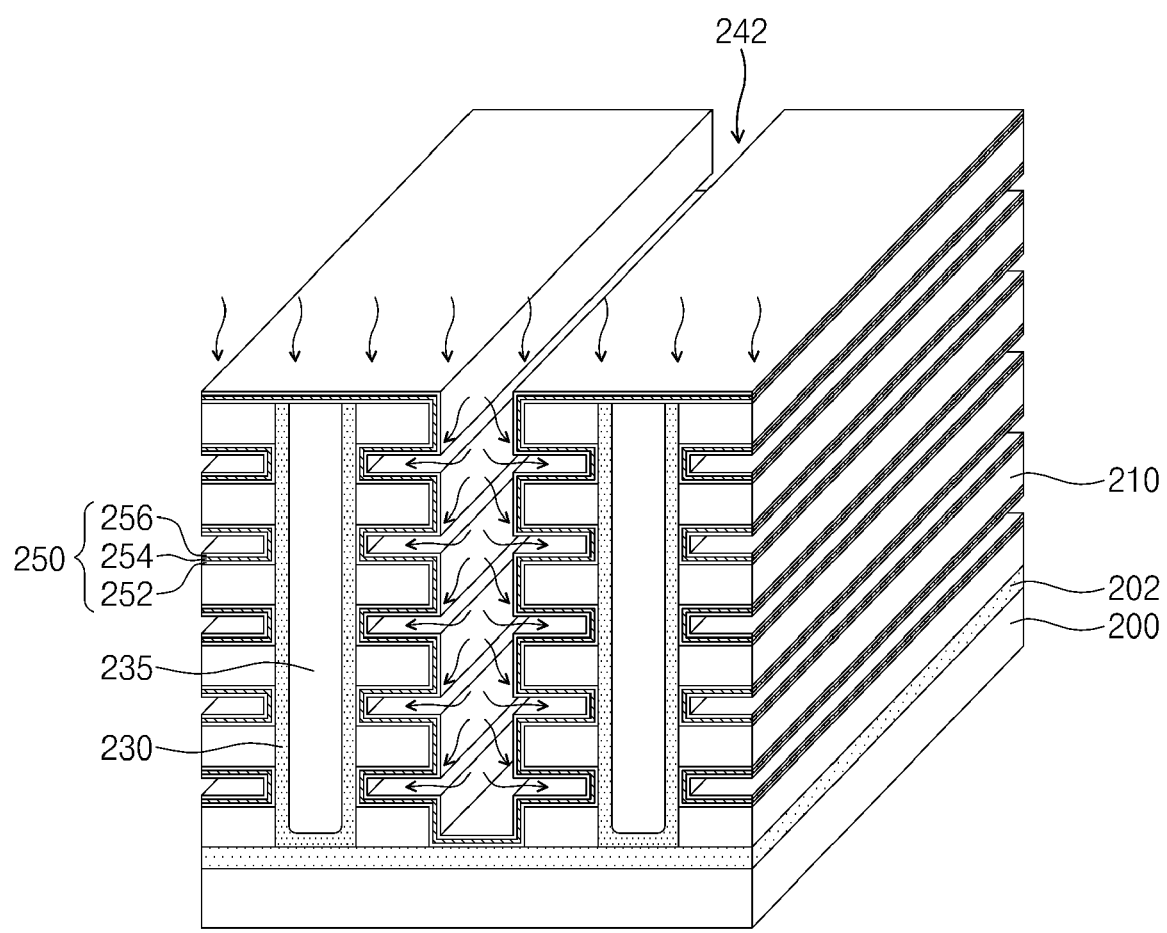

Referring to FIGS. 16 and 20A, a storage element 250 is formed on the sidewall of the semiconductor layer 230 exposed by the second penetration region 242 (S60). According to an embodiment, forming the storage element 250 includes conformally forming a data storage film along the surface of the thin film structure where the second penetration regions 242 are formed to expose portions of the sidewall of the semiconductor layer 230. Similar to the foregoing embodiment, the storage element 250 may include a first insulating layer 252, a charge storage layer 254, and a second insulating layer 256 which are formed to sequentially cover the sidewall of the semiconductor layer 230. The charge storage layer 254 may be at least one of charge-trap-site-rich insulating thin films such as a silicon nitride layer, an insulting thin film containing nano dots, and a conductive thin film which may be locally patterned to function as a floating electrode. The storage element 250 is not limited to a thin film for charge storage and may be a thin film capable of storing data based on another operation principle (e.g., a thin film for a variable resistance memory).

Figure 17:
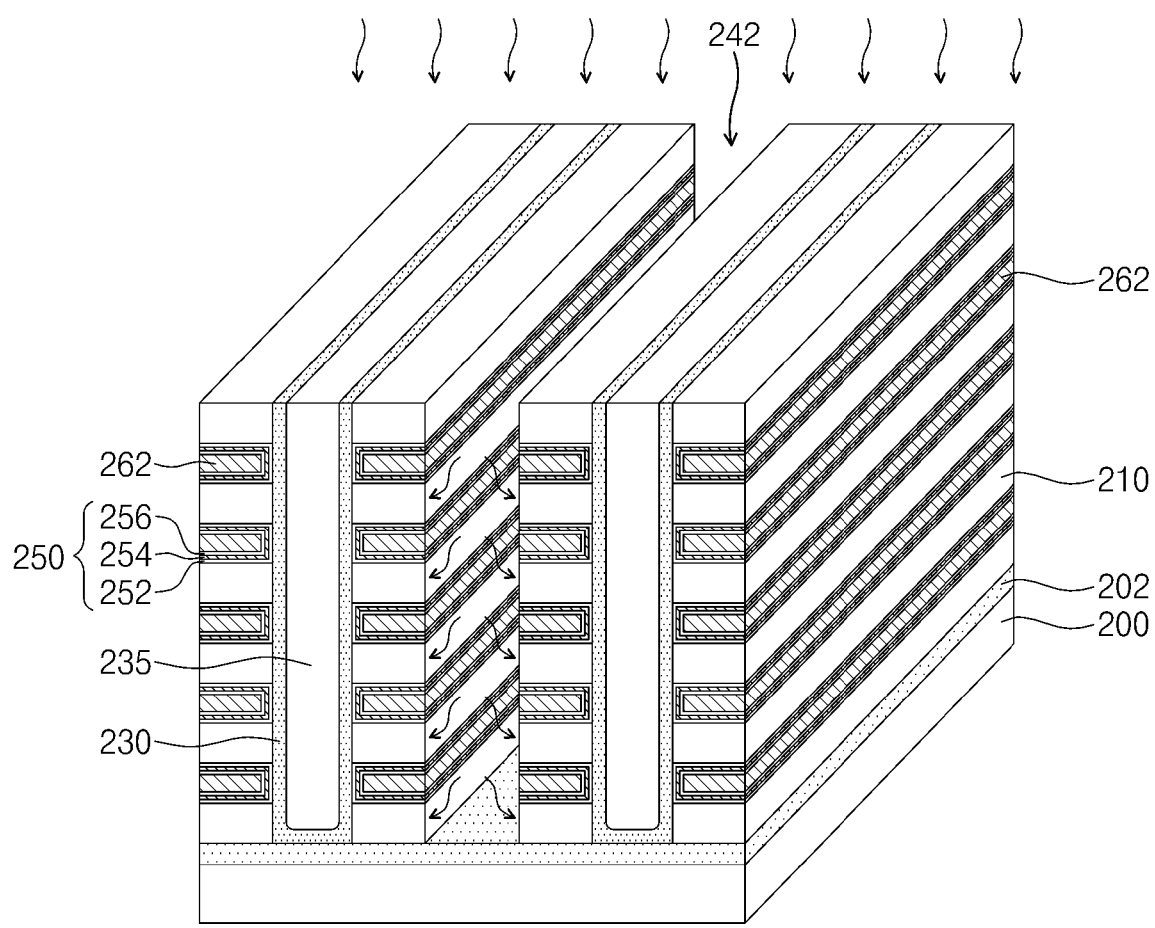

Referring to FIGS. 17 and 20A, gate electrodes 262 are formed between the stacked first insulating layers 210 (S70). Forming the gate electrodes 262 may include forming a gate conductive layer in the second penetration regions 242 where the storage element 250 is formed and patterning the gate conductive layer to re-form the second penetration region 242.

Forming the gate conductive layer may be done by means of a film formation process for forming a film having excellent step coverage such as a CVD process. Thus, the gate conductive layer may fill a space between the stacked first insulating layers 210. The gate conductive layer may be formed of polysilicon or a metal material.

Re-forming the second penetration region 242 may include forming a mask pattern and anisotropically etching the gate conductive layer by using the mask pattern as an etch mask. In this case, the second penetration regions 242 are re-formed to expose the sidewalls of the first material layers 210 such that electrically isolated conductive patterns are formed. According to an embodiment, when the gate conductive layer is anisotropically etched, the storage formed at the sidewall of the first insulating layer 210 may also be anisotropically etched to form gate electrodes 262 between the perpendicularly adjacent first insulating layers 210. Moreover, a storage element 250 may be locally formed between the first insulating layers 210. According to the inventive concept, the gate electrodes may be formed in line type. The line-type gate electrodes may be three-dimensionally arranged on the semiconductor substrate 200.

Figure 18:
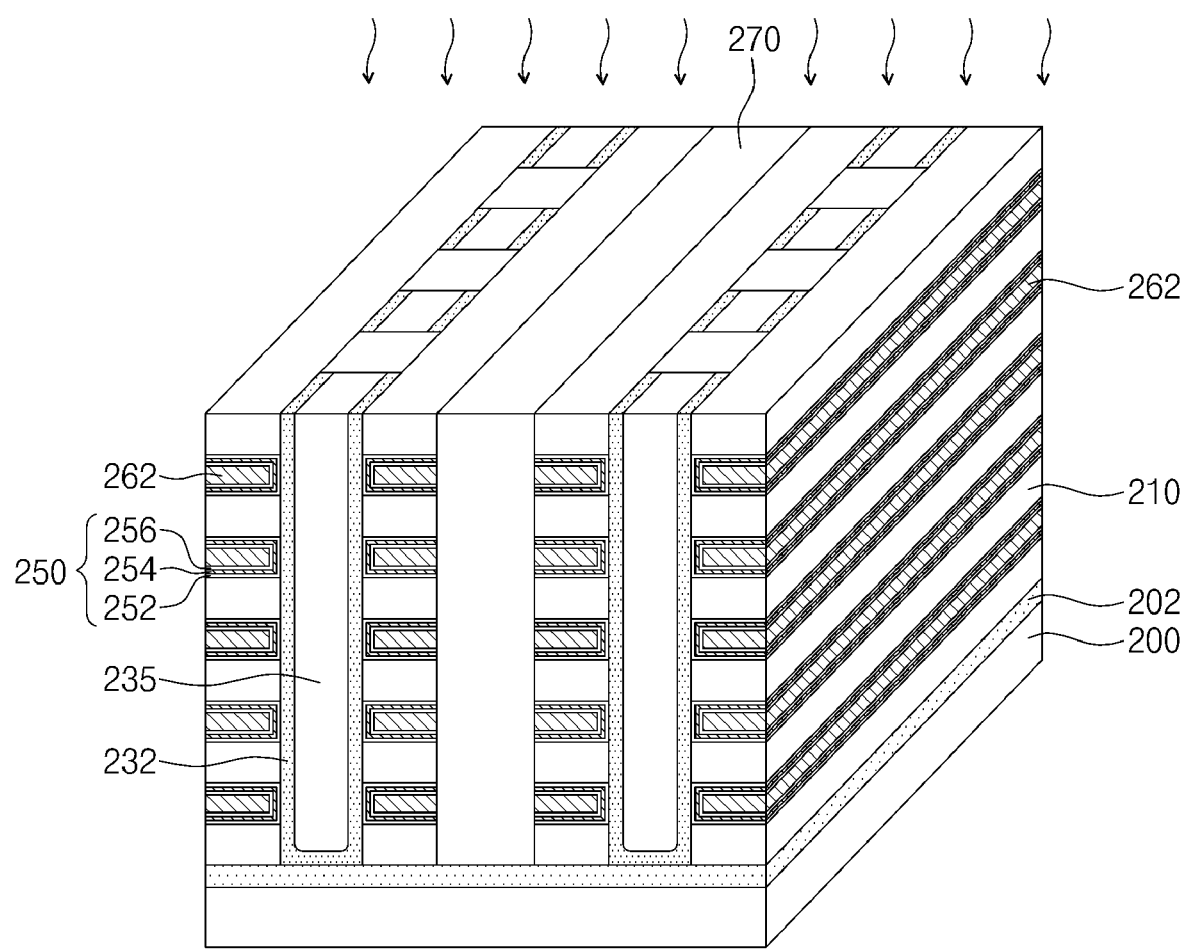

Referring to FIGS. 18 and 20A, after forming the gate electrodes 262, an insulating layer 270 fills the interior of the re-formed second penetration region 242 (S80). That is, the insulating layer 270 fills the interior of the re-formed second penetration region 242 and a top surface of the insulating layer 270 is planarized.

Next, line-type semiconductor patterns 232 may be formed to be perpendicular to the semiconductor substrate 200 by patterning the semiconductor substrate 230 in line type (S90). Forming the semiconductor pattern 232 may be done before forming the second penetration regions 242. Thus, line-type semiconductor patterns 232 may be formed which cross one side walls of the stacked gate electrodes 262 and are spaced apart form each other.

Figure 19:
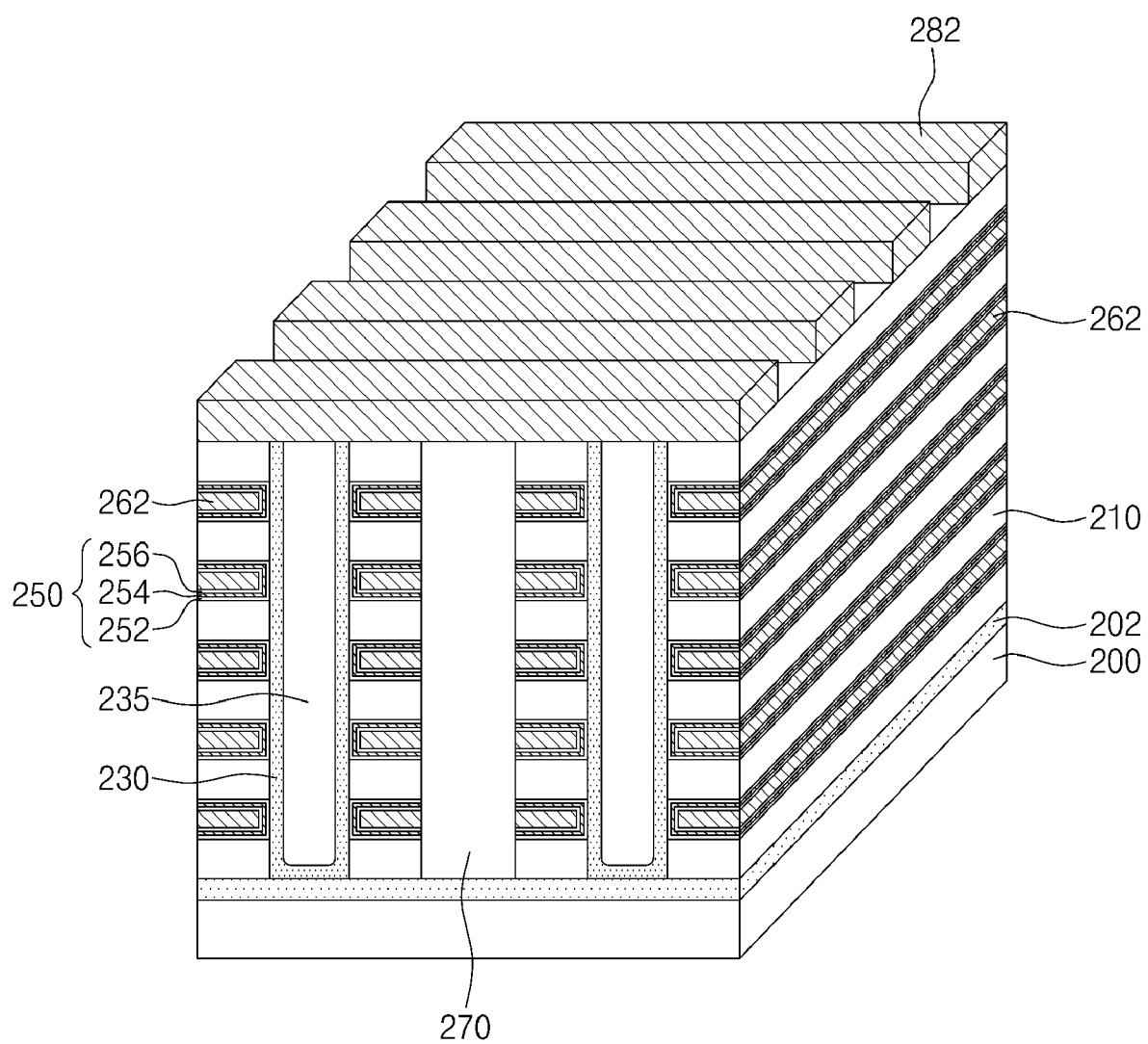
Figure 20A:
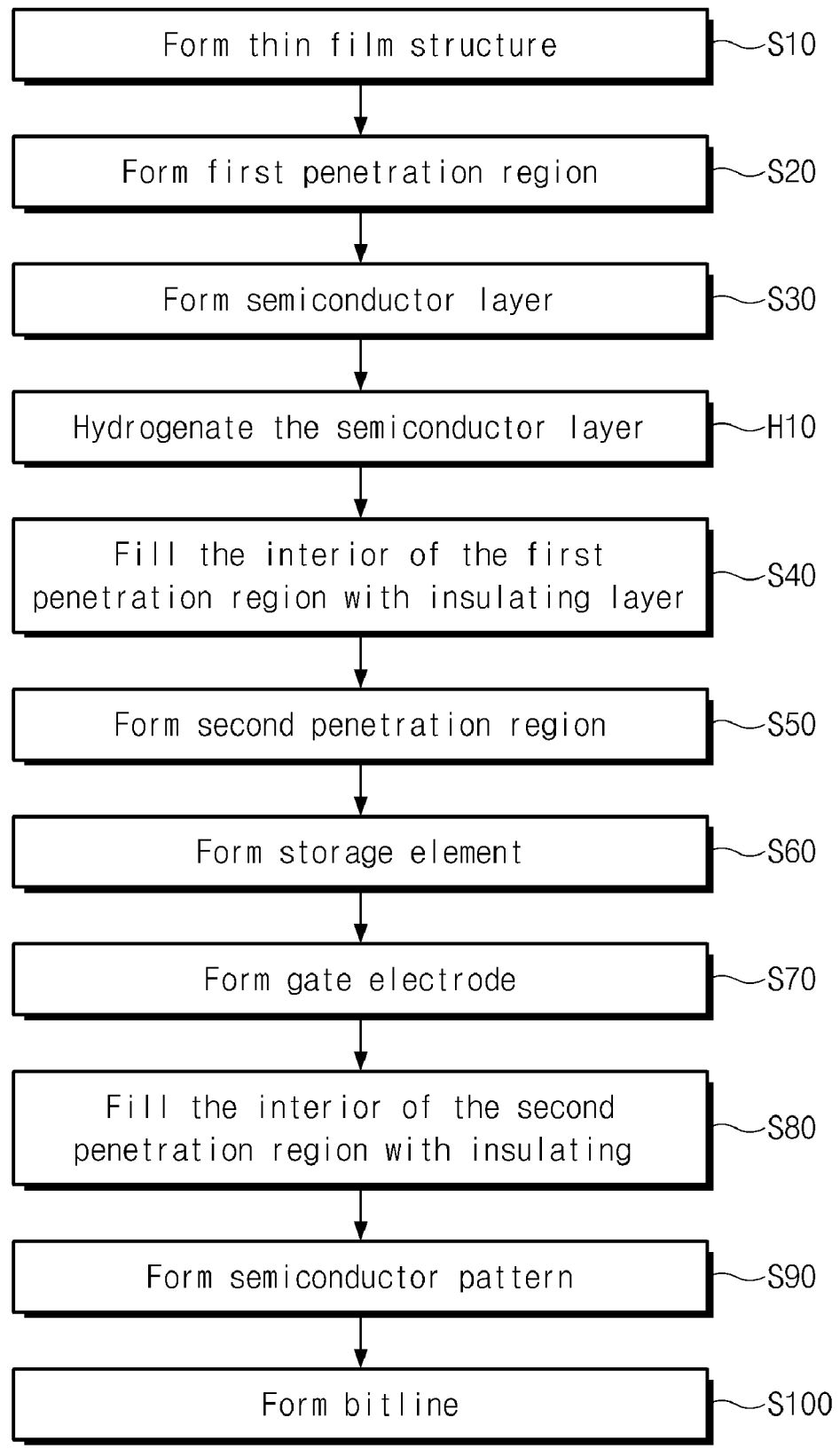
FIGS. 20A to 20F are flowcharts illustrating a method for fabricating a semiconductor memory device according to another embodiment of the inventive concept.

Referring to FIGS. 19 and 20A, bit lines 282 may be formed to connect with the semiconductor patterns 232 (S100). Forming the bit lines 282 may include depositing a gate conductive layer and patterning the gate conductive layer to form in line type. Bit lines 282 may be formed to be perpendicular to a major axis direction of gate electrodes. In addition, the bitlines 282 may be in direct contact with the semiconductor pattern 232 and be connected to the semiconductor pattern 232 through a contact plug.

As shown in FIG. 20A, according to an embodiment, after forming a semiconductor layer in a first penetration region, the semiconductor layer is post-treated with a post-treatment material containing hydrogen or deuterium. That is, the semiconductor layer is hydrogenated (H10). Hydrogenating the semiconductor layer includes supply hydrogen ions generated from the post-treatment material to the semiconductor layer. Post-treating the semiconductor layer may include generating hydrogen ions or deuterium ions from the post-treatment material through annealing treatment or plasma treatment in a hydrogen ambient. Post-treating the semiconductor layer may include supplying process gas containing at least one of $H_2$, $H_2O$, $D_2O$, and $NH_3$ to the semiconductor layer.

When annealing treatment or plasma treatment is performed in hydrogen ambient, hydrogen ions or deuterium ions are permeated and diffused into the semiconductor layer 230 exposed to the first penetration region to bond crystalline defect of the semiconductor layer 230 to the hydrogen ions or deuterium ions. Thus, trap sites caused by the crystalline defect at the semiconductor layer 230 may be removed and the potential change at the grain boundary at the semiconductor layer 230 may be reduced. As a result, mobility of the charges at the semiconductor layer 230 used as a channel of a memory cell and select transistors may be improved.

Figure 20B:
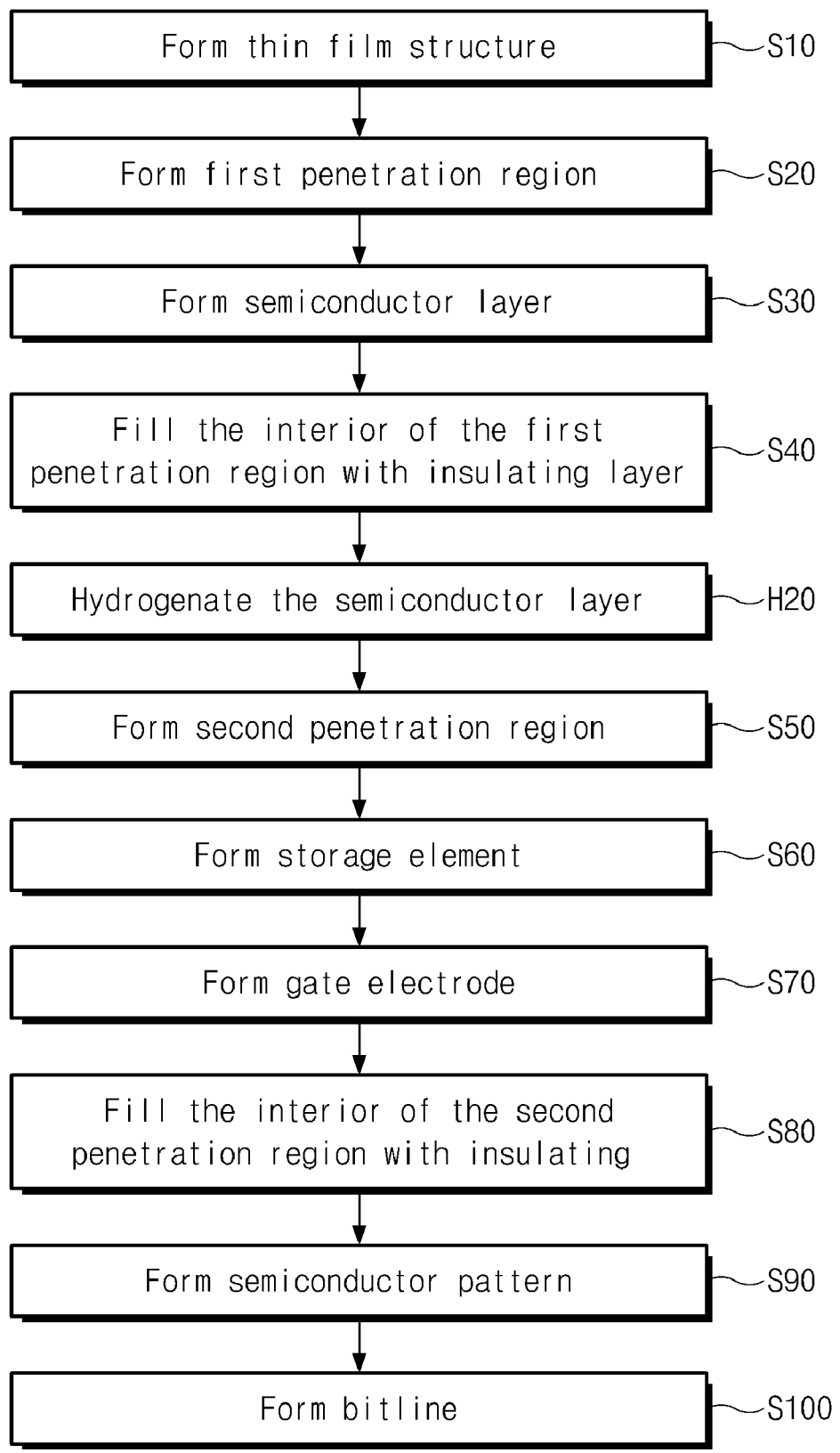

According to another embodiment, as shown in FIG. 20B, after the interior of a first penetration region where a semiconductor layer is formed is filled with an insulating material to form a filling layer, the semiconductor layer is hydrogenated (H20). That is, when an annealing process or a plasma treatment process is performed using process gas containing hydrogen atoms while the semiconductor layer is covered with the filling layer, hydrogen atoms may be permeated through the semiconductor layer. Thus, the semiconductor layer 230 may be hydrogenated while not being exposed to the hydrogen ambient.

Figure 20C:
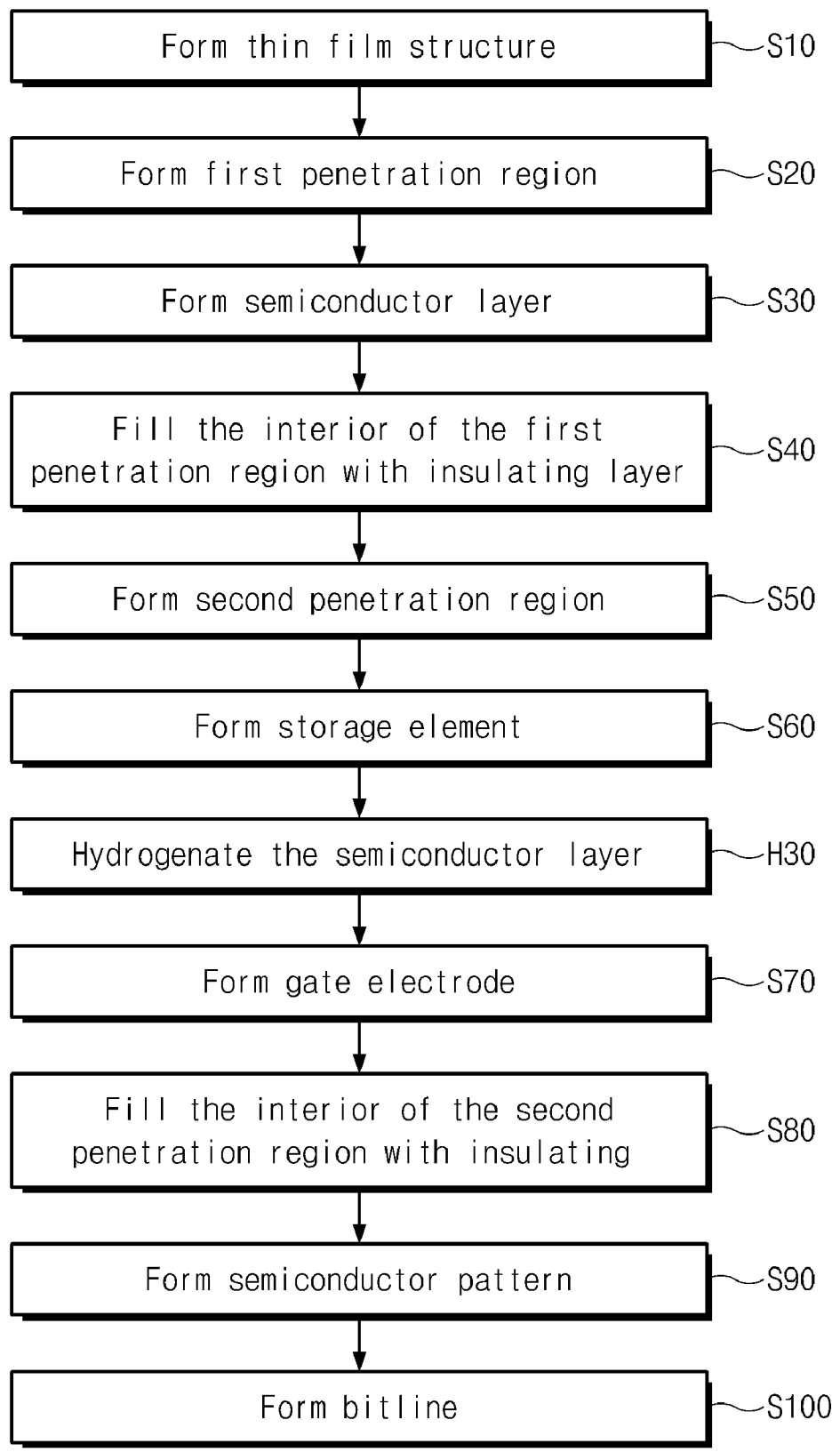

According to another embodiment, as shown in FIG. 20C, after forming a storage element, a semiconductor layer may be hydrogenated (H30). That is, hydrogen atoms may be supplied to the semiconductor layer 230 through the penetration region 242 while the storage element is exposed to the hydrogen ambient.

Figure 20D:
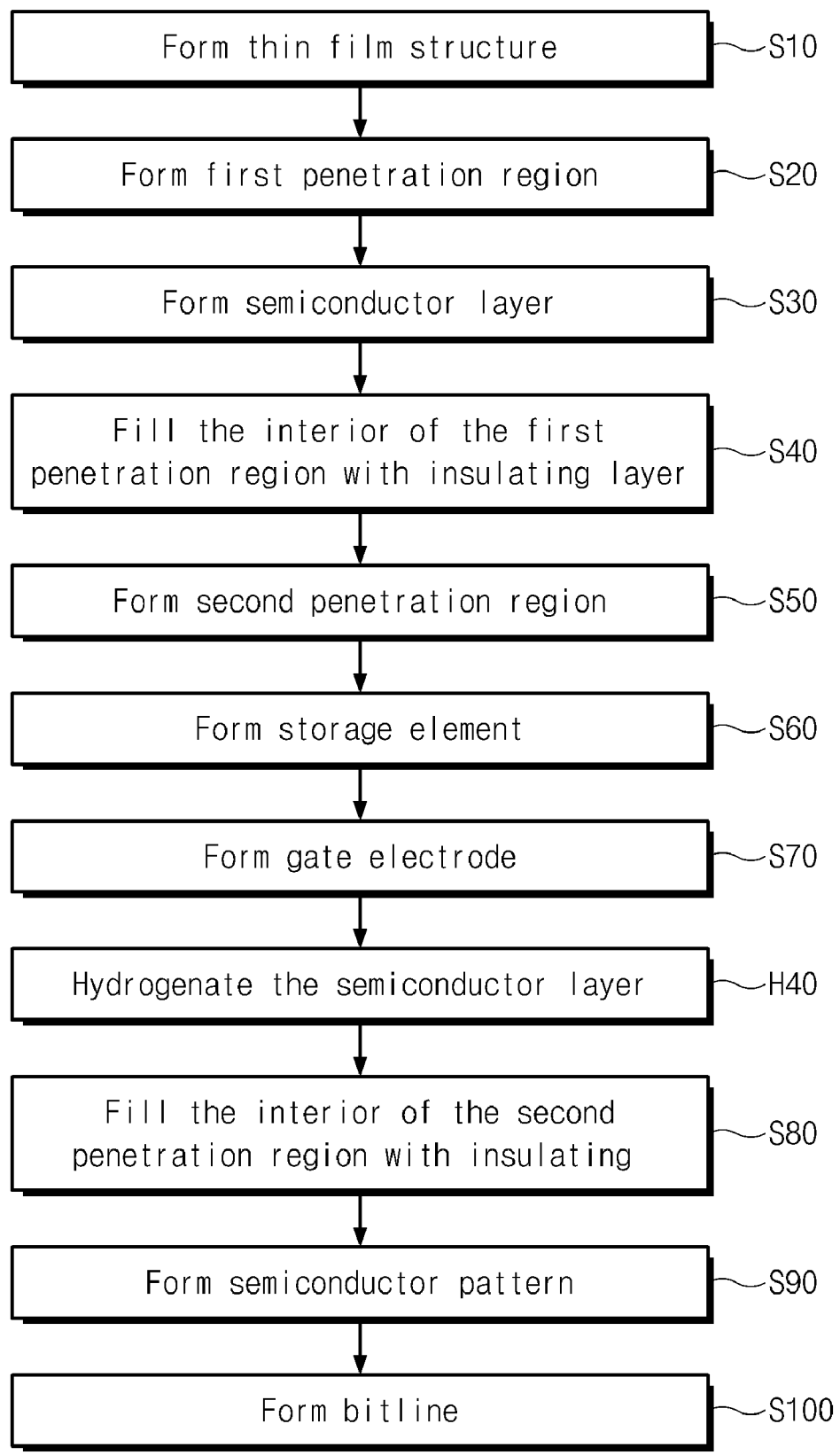

According to another embodiment, as shown in FIG. 20D, after forming a gate electrode, a semiconductor layer may be hydrogenated (H40).

Figure 20E:
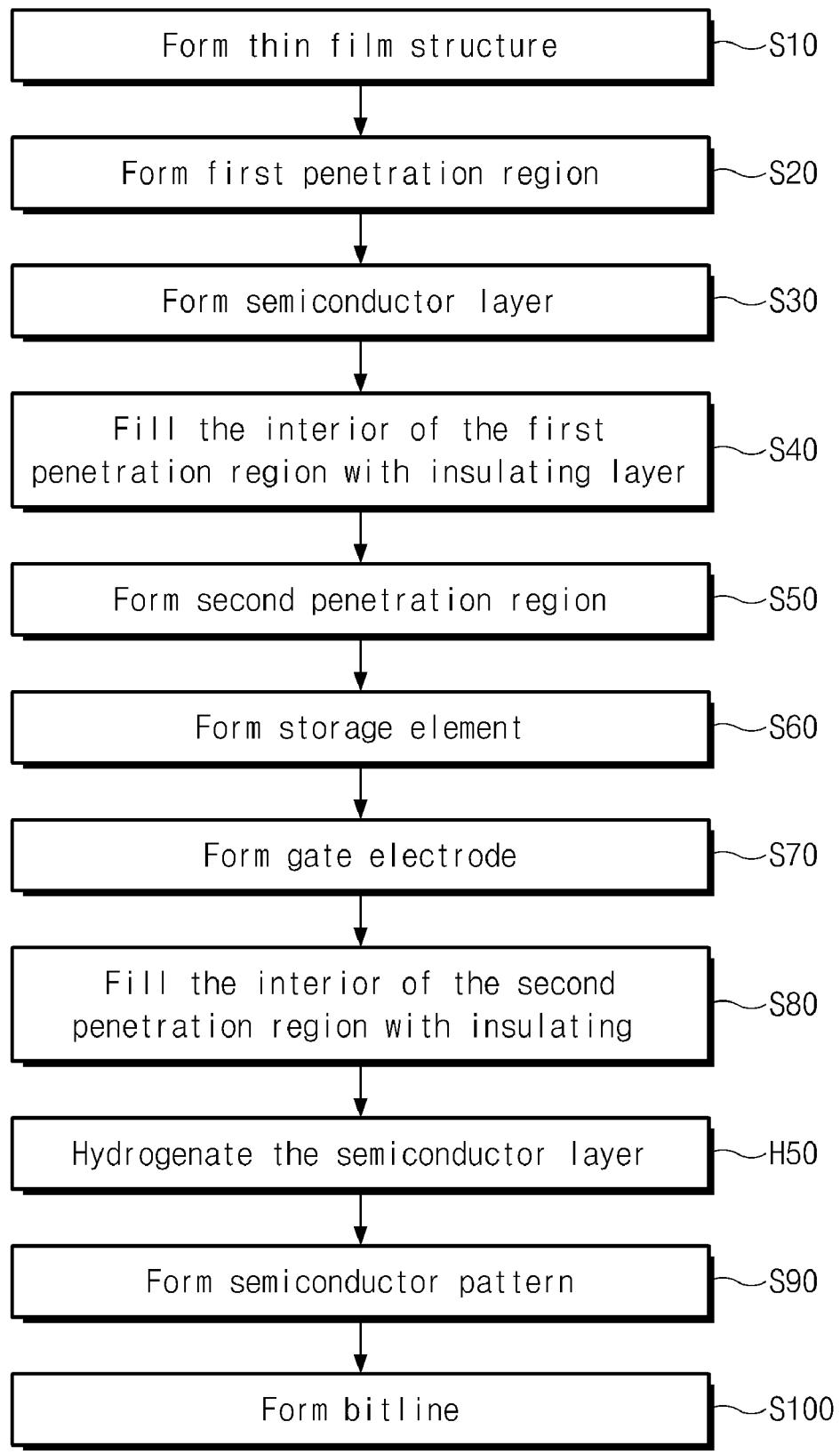

According to another embodiment, as shown in FIG. 20E, after filling the interiors of second penetration regions with an insulating layer, a semiconductor may be hydrogenated (H50).

Figure 20F:
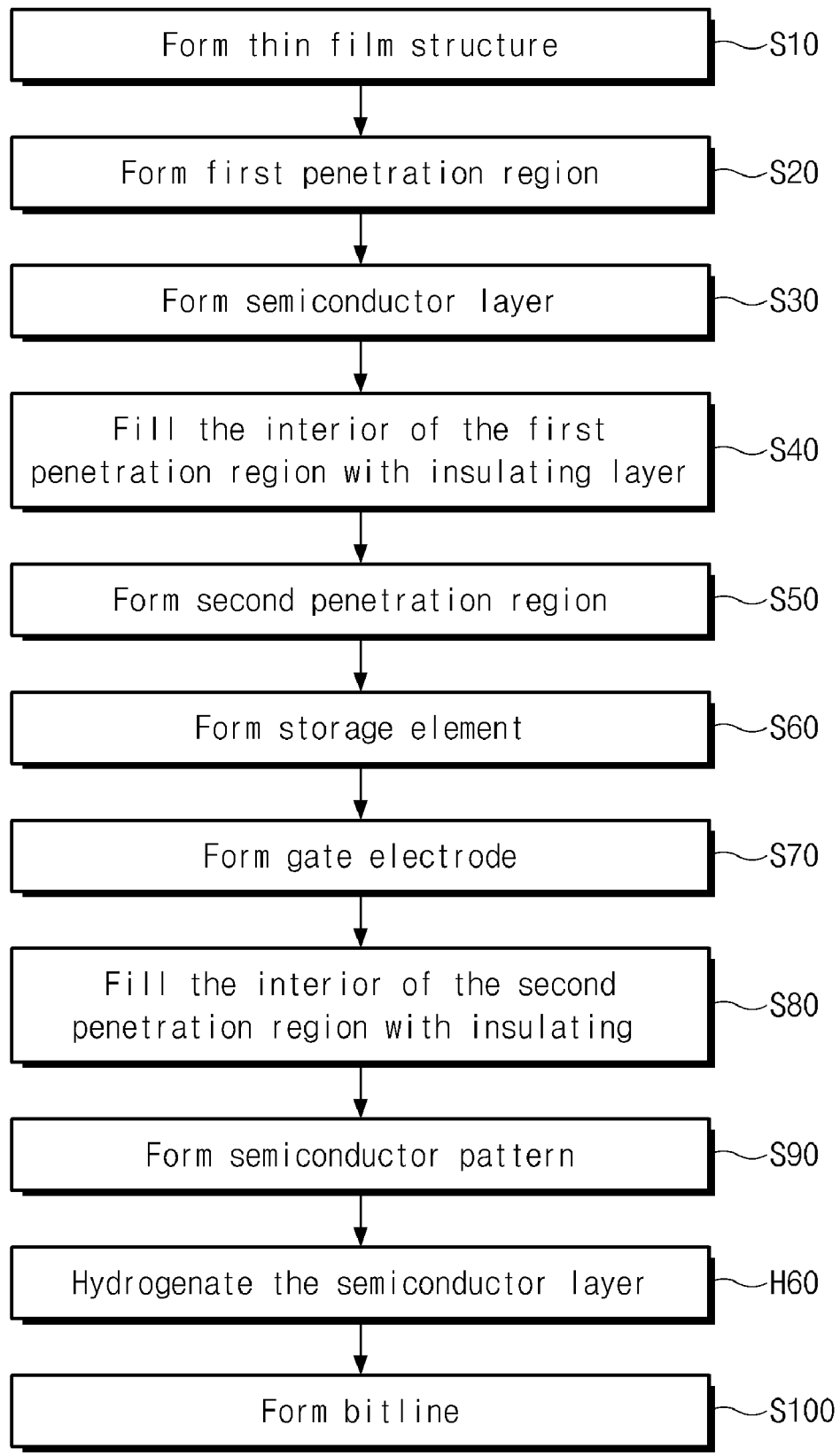

According to another embodiment, as shown in FIG. 20F, after a semiconductor pattern is formed by patterning a semiconductor in type of a line that is perpendicular to a semiconductor substrate, it may be hydrogenated (H60).

As set forth with reference to FIGS. 20A to 20F, hydrogenating a semiconductor layer is performed once during fabrication of a semiconductor memory device according to embodiments of the inventive concept. However, hydrogenating a semiconductor layer is not limited to the foregoing embodiments and may be done once or more times.

According to this embodiment, as shown in FIG. 14, the filing layer 235 filling the first penetration region 222 may be a hydrogen-rich containing layer. The hydrogen-rich containing layer may be a source supplying hydrogen ions or deuterium ions to a semiconductor layer. That is, the filling layer 235 contacting the semiconductor layer 230 may be formed to supply hydrogen atoms to a semiconductor layer during a high-temperature annealing process and prevent dissociation of hydrogen atoms bonded to silicon at the hydrogenated semiconductor layer 230. The filling layer 235 is formed using $SiH_4$ gas and may contain a large amount of hydrogen atoms during its formation. For instance, a hydrogen supply layer may be formed of at least one of SOG materials, hydrogen-rich oxide (e.g. PE-oxide, HDP oxide), hydrogen-rich nitride, and hydrogen-rich oxynitride.

Figure 21:
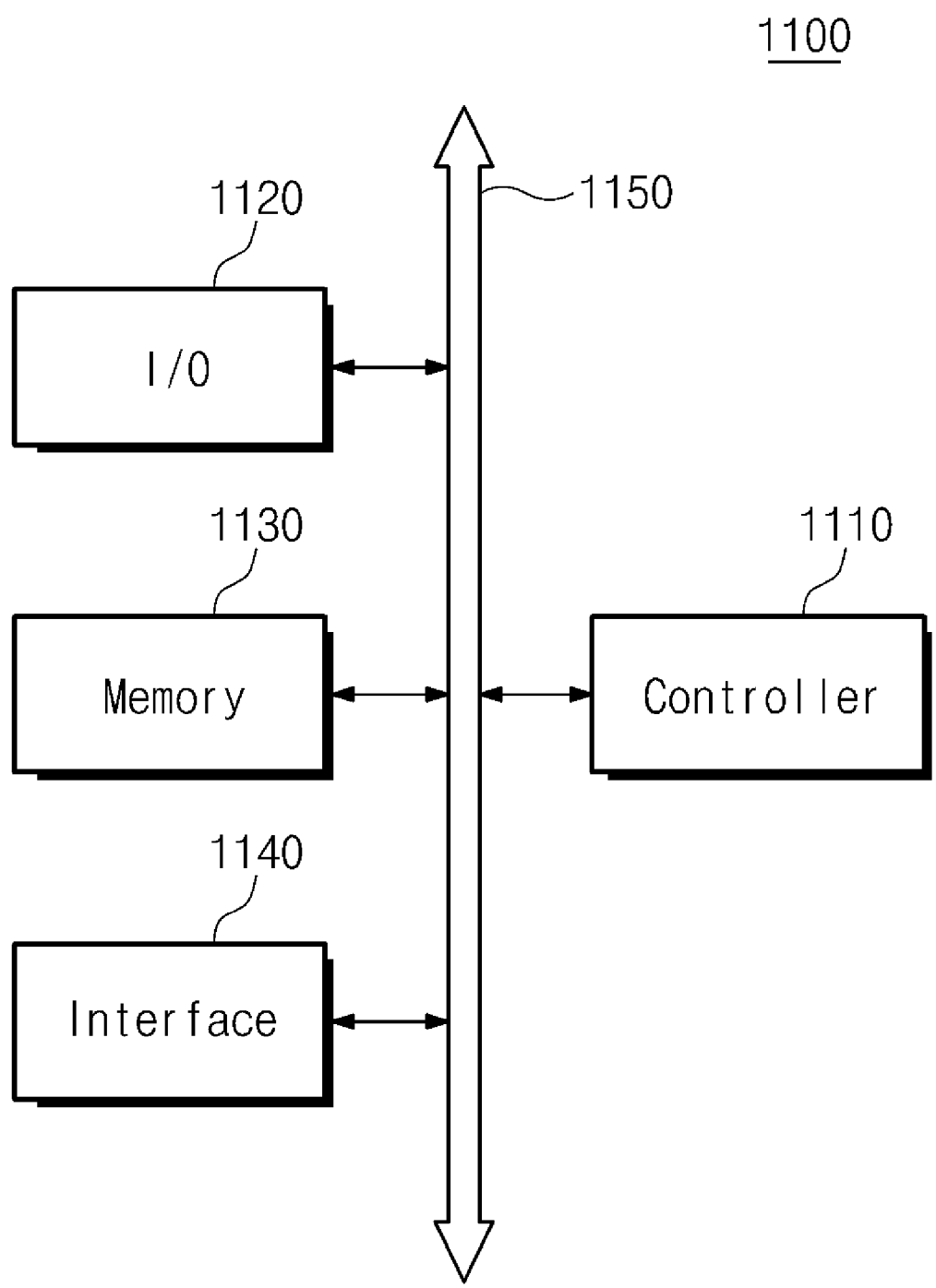
FIG. 21 is a schematic block diagram illustrating an example of a memory system including a semiconductor memory device according to embodiments of the inventive concept.

FIG. 21 is a schematic block diagram illustrating an example of a memory system including a semiconductor memory device according to embodiments of the inventive concept.

Referring to FIG. 21, a memory system 1100 may be used in personal digital assistants (PDAs), laptop computers, portable computers, web tablets, wireless phones, mobile phones, digital music players, memory cards, and all devices capable of transmitting and/or receiving information in a wireless environment.

The memory system 1100 may include a controller 1110, an input/output device (I/O) 1120 such as a keypad, a keyboard, and a display, a memory 1130, and a wireless interface 1140. The memory 1130 and the interface 1140 are interconnected through a bus 1150.

The controller 1110 may include, for instance, at least one microprocessor, a digital signal processor, a microcontroller, and/or similar devices. The memory 1130 may be used to store commands executed by the controller 1110. The I/O 1120 may be configured to receive data or signals from the external entity or output data or signals to the external entity. The I/O 1120 may include, for instance, a keyboard, a keypad or a display device.

The memory 1130 includes a nonvolatile memory device according to the embodiments of the inventive concept. The memory 1130 may further include another type of memory, a random-accessible volatile memory, and various other types of memories.

The interface 1140 is configured to transmit/receive data to/from a wireless communication network.

Figure 22:
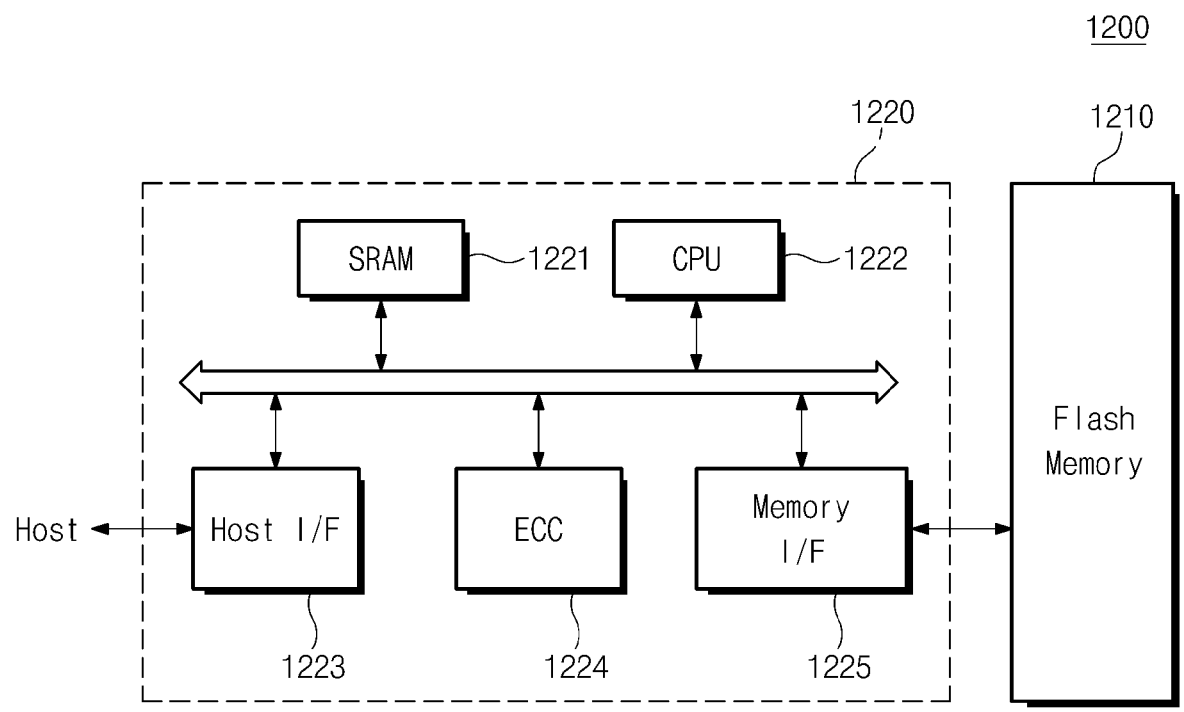
FIG. 22 is a schematic block diagram illustrating an example of a memory card including a semiconductor memory device according to embodiments of the inventive concept.

FIG. 22 is a schematic block diagram illustrating an example of a memory card including a semiconductor memory device according to embodiments of the inventive concept.

Referring to FIG. 22, the memory card 1200 is for supporting high-capacity data storage capability and includes a flash memory 1210. The memory card 1200 may include a memory controller 1220 that controls the entire data exchange between a host and the flash memory 1210.

An SRAM 1221 may be used as a working memory of a central processing unit (CPU) 1222. A host interface 1223 may have data exchange protocol of a host connected to the memory card 1200. An error correction circuit (ECC) 1224 may detect and correct an error included in data read from the flash memory 1210. A memory interface 1225 interfaces with the flash memory 1210. The CPU 1222 performs the entire control operation for data exchange of the memory controller 1220. Although not shown in the drawings, it is apparent to those skilled in the art that the memory card 1200 may further include a ROM (not shown) that stores code data for interfacing with the host.

Figure 23:
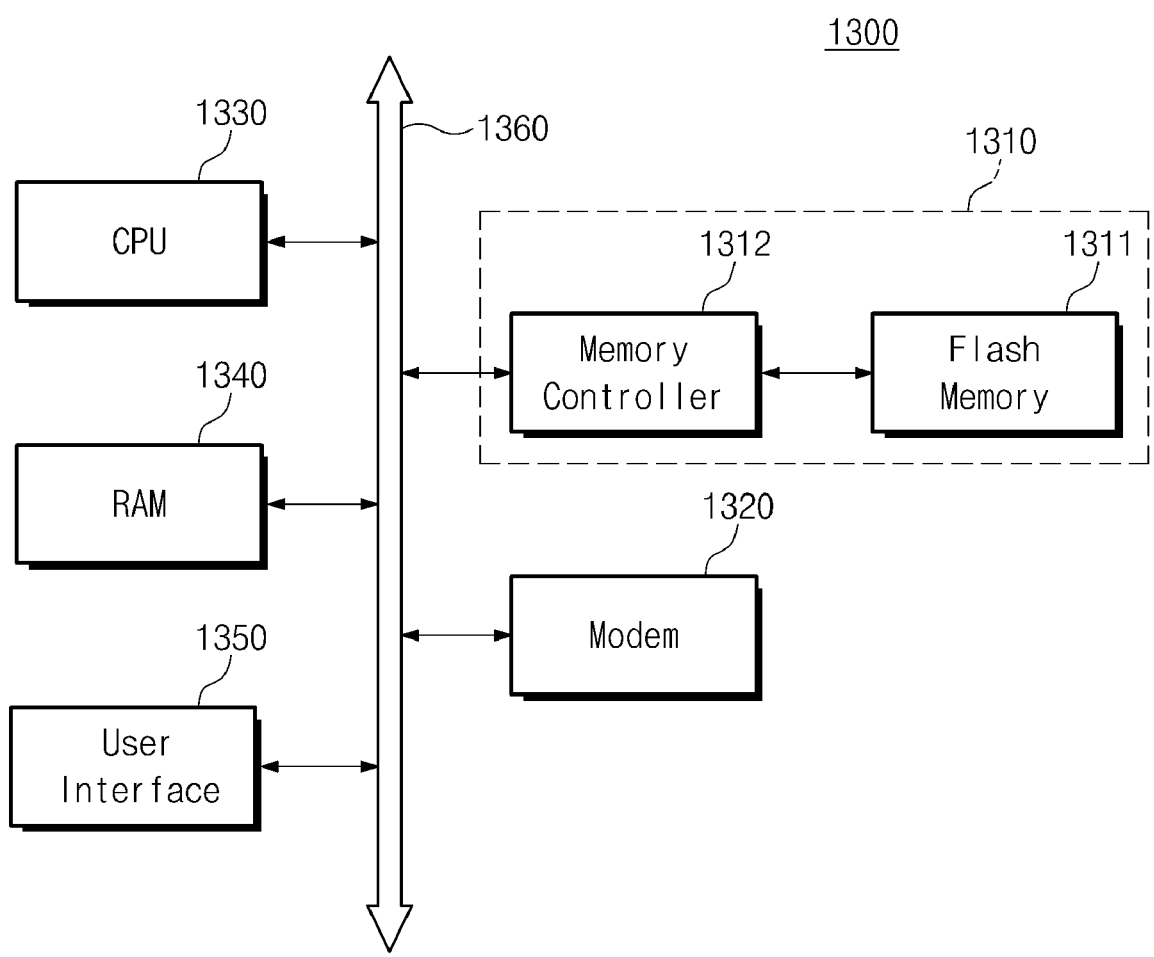
FIG. 23 is a schematic block diagram illustrating an example of an information processing system including a semiconductor memory device according to embodiments of the inventive concept.

FIG. 23 is a schematic block diagram illustrating an example of a processing system including a semiconductor memory device according to embodiments of the inventive concept.

Referring to FIG. 23, an information processing system 1300 such as a mobile device or a desktop computer is provided with a flash memory system 1310 according to the inventive concept. The information processing system 1300 may include a flash memory system 1310 and a modem 1320 which are electrically connected to a system bus 1360, a central processing unit (CPU) 1330, a RAM 1340, and a user interface 1350. The flash memory system 1310 may be organized with the same structure as the above-described memory system or flash memory system. Data processed by the CPU 1330 or externally input data may be stored in the flash memory system 1310. The flash memory system 1310 may be configured with a semiconductor disk device (SSD). In this case, the information processing system 1300 can stably and reliably store high-capacity data in the flash memory system 1310. With the increase in reliability, the flash memory device 1310 may reduce resources required for error correction to provide a high-speed data exchange function to the information processing system 300. Although not shown in the figure, it is apparent to those skilled in the art that the information processing system 1300 may further include an application chipset, a camera image processor (CIS), and an input/output device.

A flash memory device or a memory system according to the inventive concept may be packaged using various types of packages. For example, a flash memory device or memory controller according to the inventive concept may be packaged using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

According to the inventive concept, a semiconductor layer is hydrogenated to effectively cure crystalline defects which may exist in a semiconductor pattern or effectively reduce potential changes at a grain boundary constituting a semiconductor pattern. Thus, in a three-dimensional semiconductor memory device, transistors using a semiconductor pattern formed to be perpendicular to a semiconductor substrate as a channel have improved electrical characteristics (e.g., improved charge mobility).

Although the inventive concept has been described in connection with the embodiments illustrated in the accompanying drawings, it is not limited thereto. It will be apparent to those skilled in the art that various substitutions, modifications and changes may be made without departing from the scope and spirit of the inventive concept.

What is claimed is:
1. A method for fabricating a three-dimensional semiconductor memory device provided with three-dimensionally arranged memory transistors, the method comprising:
   forming a thin film structure including a plurality of thin films on a semiconductor substrate;

patterning the thin film structure such that a penetration region is formed to expose the semiconductor substrate;

forming a polycrystalline semiconductor layer to cover the resultant structure where the penetration region is formed;

patterning the polycrystalline semiconductor layer to locally form a semiconductor pattern in the penetration region; and post-treating the semiconductor layer or the semiconductor pattern with a post-treatment material containing hydrogen or deuterium.

2. The method as set forth in claim 1, wherein:
the semiconductor layer is formed of polysilicon including crystalline defects; and
post-treating the semiconductor layer or the semiconductor pattern comprises bonding hydrogen ions or deuterium ions generated from the post-treatment material to atoms of the polysilicon to remove at least a portion of the crystalline defects.

3. The method as set forth in claim 1, wherein post-treating the semiconductor layer or the semiconductor pattern comprises supplying at least one of hydrogen gas, deuterium gas, vapor, deuterium vapor and ammonia to the semiconductor pattern.

4. The method as set forth in claim 1, wherein post-treating the semiconductor layer or the semiconductor pattern comprises generating hydrogen ions or deuterium ions from the post-treatment material through an annealing or plasma treatment.

5. The method as set forth in claim 1, further comprising forming a data storage film to cover an inner sidewall of the penetration region, wherein forming the semiconductor layer comprises filling the penetration region, where the data storage film is formed, with the semiconductor layer.

6. The method as set forth in claim 1, further comprising forming a data storage film to cover an inner sidewall of the penetration region, wherein forming the semiconductor layer comprises forming the semiconductor layer to define a gap region within the penetration region and cover an inner sidewall of the penetration region where the data storage film is formed, and a thickness of the semiconductor layer is smaller than a half width of the penetration region.

7. The method as set forth in claim 6, further comprising, before or after patterning the semiconductor layer, forming a filling layer to fill the gap region.

8. The method as set forth in claim 7, wherein post-treating the semiconductor layer or the semiconductor pattern is performed before or after forming the filling layer.

9. The method as set forth in claim 6, wherein:
post-treating the semiconductor layer or the semiconductor pattern comprises forming a filling layer to fill the gap region;
forming the filling layer is performed before or after patterning the semiconductor layer, and
the filling layer comprises the post-treatment material containing hydrogen or deuterium.

10. The method as set forth in claim 9, wherein the filling layer comprises at least one of SOG materials, hydrogen-rich oxide, hydrogen-rich nitride, and hydrogen-rich oxynitride.

11. The method as set forth in claim 1, wherein:
the thin film structure includes a first material layer and a second material layer stacked sequentially and repeatedly; and
the first material layer is formed of an insulating material and the second material layer is formed of a conductive material.

12. The method as set forth in claim 1, wherein:
the thin film structure includes a first material layer and a second material layer stacked sequentially and repeatedly; and
the first material layer and the second material layer are insulating layers formed of different materials.

13. The method as set forth in claim 12, further comprising:
forming a trench to penetrate the second material layer constituting the thin film structure between the semiconductor patterns;
selectively removing the second material layers to form an undercut region exposing a sidewall of the semiconductor pattern between the first material layers; and
forming conductive patterns to fill the undercut region.

14. The method as set forth in claim 13, wherein post-treating the semiconductor layer or the semiconductor pattern is performed at one or more points between forming the trench and forming the undercut region, between forming the undercut region and forming the conductive patterns, and after forming the conductive patterns.

15. The method as set forth in claim 1, wherein post-treating the semiconductor layer or the semiconductor pattern is performed at one or more points between forming the semiconductor layer and forming the semiconductor pattern or after forming the semiconductor pattern.

16. A method for fabricating a three-dimensional semiconductor device including three-dimensionally arranged memory transistors and a plurality of semiconductor patterns used as channel regions of the memory transistors and disposed perpendicular to a semiconductor substrate, the method comprising:
forming the semiconductor pattern of a polycrystalline semiconductor material; and
post-treating polycrystalline semiconductor material with a post-treatment material containing hydrogen or deuterium.

17. The method as set forth in claim 16, wherein post-treating the polycrystalline semiconductor materials comprises supplying at least one of hydrogen gas, deuterium gas, vapor, deuterium vapor and ammonia to the semiconductor pattern.

18. The method as set forth in claim 16, further comprising, before forming the semiconductor pattern, forming a conductive layer used as a gate electrode of the memory transistor.

19. The method as set forth in claim 16, further comprising, after forming the semiconductor pattern, forming a conductive layer used as a gate electrode of the memory transistor.

20. The method as set forth in claim 16, wherein:
the semiconductor pattern is a hollow pattern having a gap region formed therein; and
post-treating the polycrystalline semiconductor material comprises filling the gap region of the semiconductor pattern with the post-treatment material.

* * * * *